United States Patent
Hohlfeld et al.

(10) Patent No.: US 9,972,596 B2
(45) Date of Patent: May 15, 2018

(54) CHIP ASSEMBLAGE, PRESS PACK CELL AND METHOD FOR OPERATING A PRESS PACK CELL

(71) Applicant: Infineon Technologies AG, Neubiberg (DE)

(72) Inventors: Olaf Hohlfeld, Warstein (DE); Juergen Hoegerl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 14/926,615

(22) Filed: Oct. 29, 2015

(65) Prior Publication Data
US 2016/0126212 A1    May 5, 2016

(30) Foreign Application Priority Data

Oct. 31, 2014 (DE) .......................... 10 2014 115 909

(51) Int. Cl.
*H01L 23/00* (2006.01)
*H01L 25/065* (2006.01)

(52) U.S. Cl.
CPC .............. *H01L 24/72* (2013.01); *H01L 24/24* (2013.01); *H01L 24/82* (2013.01);
(Continued)

(58) Field of Classification Search
CPC ..... H01L 2924/13091; H01L 2924/181; H01L 2224/48247
See application file for complete search history.

(56) References Cited

U.S. PATENT DOCUMENTS

| 7,408,251 B2* | 8/2008 | Hata ................. H01L 23/49562 257/666 |
| 7,538,436 B2* | 5/2009 | Gunturi ................. H01L 23/051 257/773 |

(Continued)

FOREIGN PATENT DOCUMENTS

DE    10 2013 217 801    3/2015

Primary Examiner — Marcos D Pizarro Crespo
Assistant Examiner — Shannon Yi
(74) Attorney, Agent, or Firm — Dicke, Billig & Czaja, PLLC

(57) ABSTRACT

One aspect of the invention relates to a chip assemblage. The latter comprises a number of semiconductor chips, each of which has a semiconductor body having an underside, and also a top side, which is spaced apart from the underside in a vertical direction. A top main electrode is arranged on the top side and a bottom main electrode is arranged on the underside. Moreover, each of the semiconductor chips has a control electrode, by means of which an electric current between the top main electrode and the bottom main electrode can be controlled. The semiconductor chips are connected to one another by a dielectric embedding compound to form a solid assemblage. The chip assemblage additionally comprises a common control terminal, and a common reference potential terminal. The common control terminal is electrically conductively connected to each of the control electrodes via a control electrode interconnection structure, and the common reference potential terminal is electrically conductively connected to each of the first main electrodes via a main electrode interconnection structure. Moreover, a dedicated, electrically conductive top compensation lamina is present for each of the semiconductor chips, said top compensation lamina being arranged on that side of the top main electrode which faces away from the semiconductor body and being cohesively and electrically conductively connected to the top main electrode.

18 Claims, 17 Drawing Sheets

(52) U.S. Cl.
CPC ............. *H01L 25/0655* (2013.01); *H01L 2224/32245* (2013.01); *H01L 2924/181* (2013.01); *H01L 2924/351* (2013.01)

(56) References Cited

U.S. PATENT DOCUMENTS

| | | | | |
|---|---|---|---|---|
| 2008/0007920 | A1* | 1/2008 | Shiraki | H02M 7/003 361/717 |
| 2008/0197463 | A1* | 8/2008 | Otremba | H01L 23/49524 257/676 |
| 2009/0096503 | A1* | 4/2009 | Koellensperger | H01L 23/051 327/440 |
| 2009/0189291 | A1* | 7/2009 | Landau | H01L 23/49537 257/777 |
| 2012/0112366 | A1* | 5/2012 | Crebier | H01L 21/823481 257/777 |
| 2012/0262218 | A1* | 10/2012 | Klaka | H03K 17/06 327/383 |
| 2013/0113090 | A1* | 5/2013 | Atsumi | H01L 24/33 257/676 |
| 2015/0061100 | A1 | 3/2015 | Beer et al. | |
| 2015/0102481 | A1* | 4/2015 | Steinhoff | H01L 23/051 257/727 |
| 2015/0373851 | A1* | 12/2015 | Iwama | H05K 1/0271 361/752 |
| 2016/0315184 | A1* | 10/2016 | Ishimaru | H01L 24/01 |

\* cited by examiner

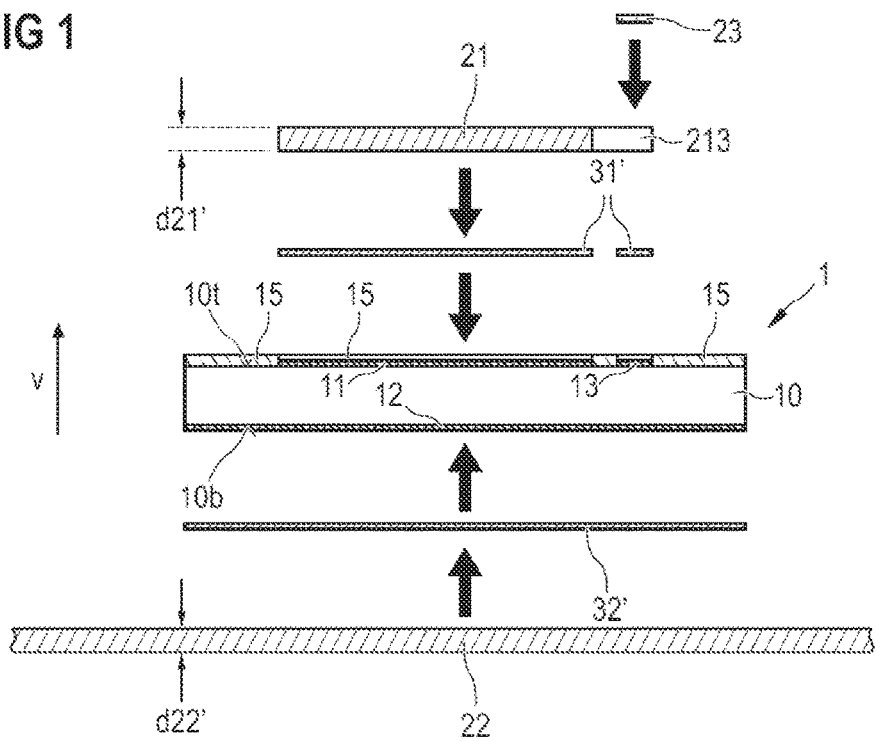
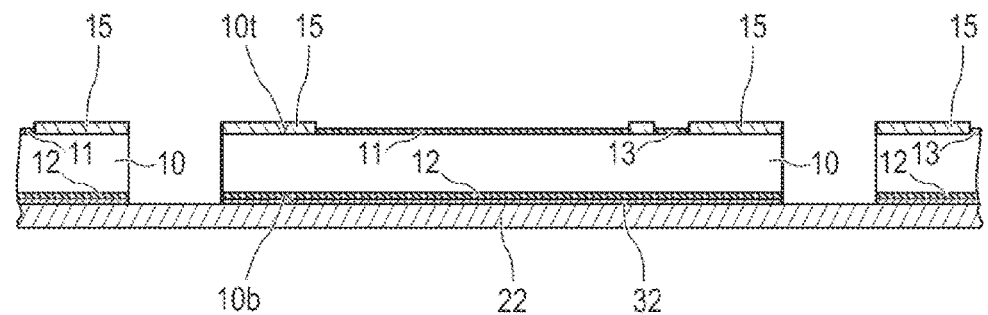
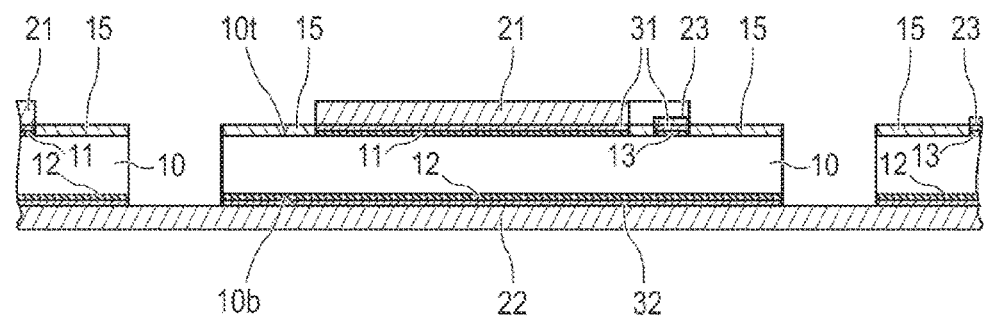

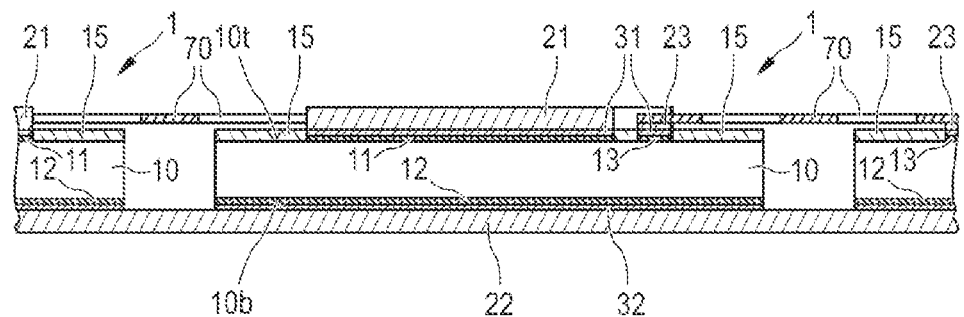
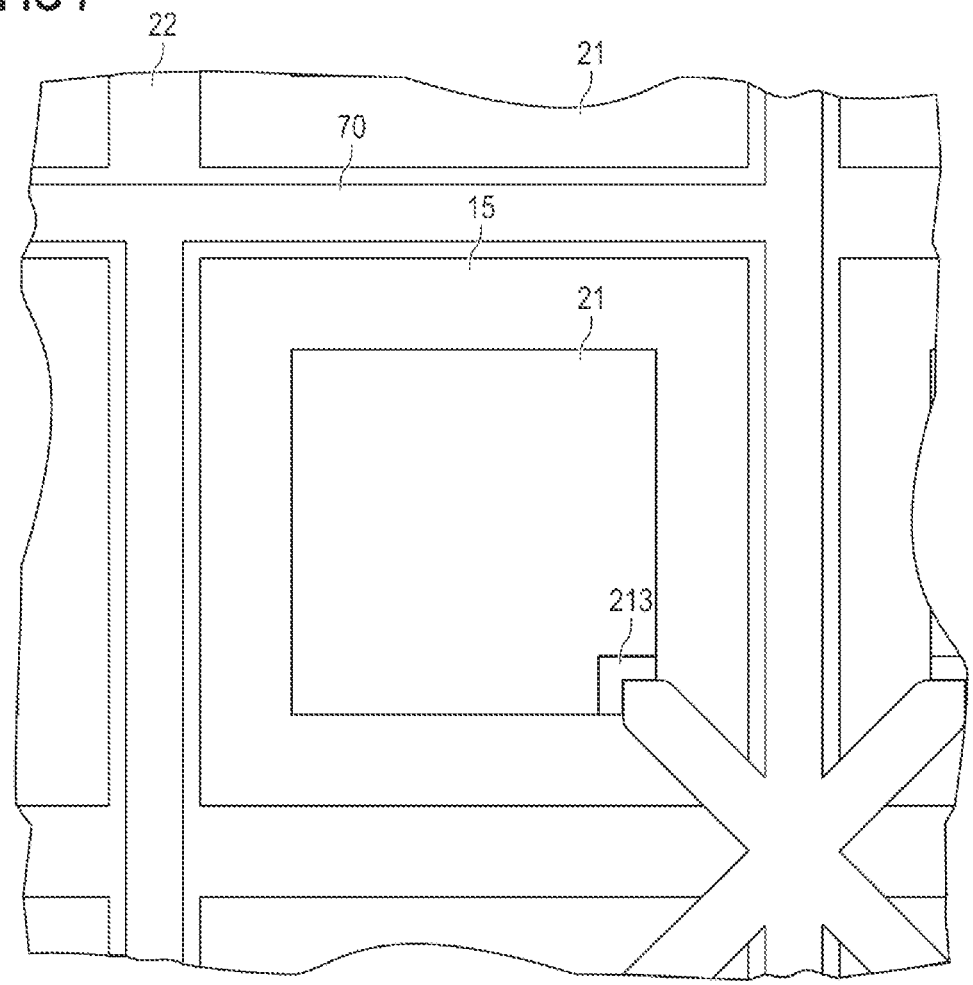

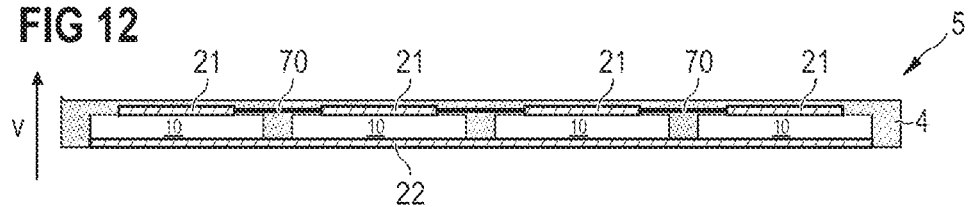
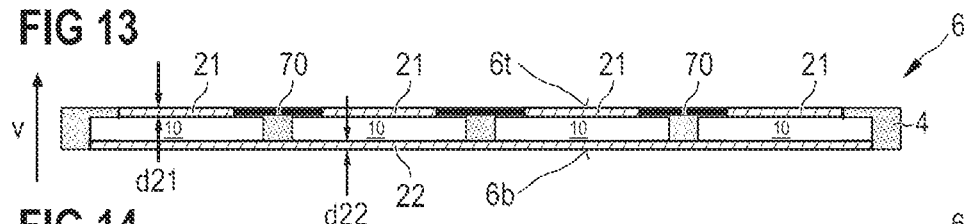
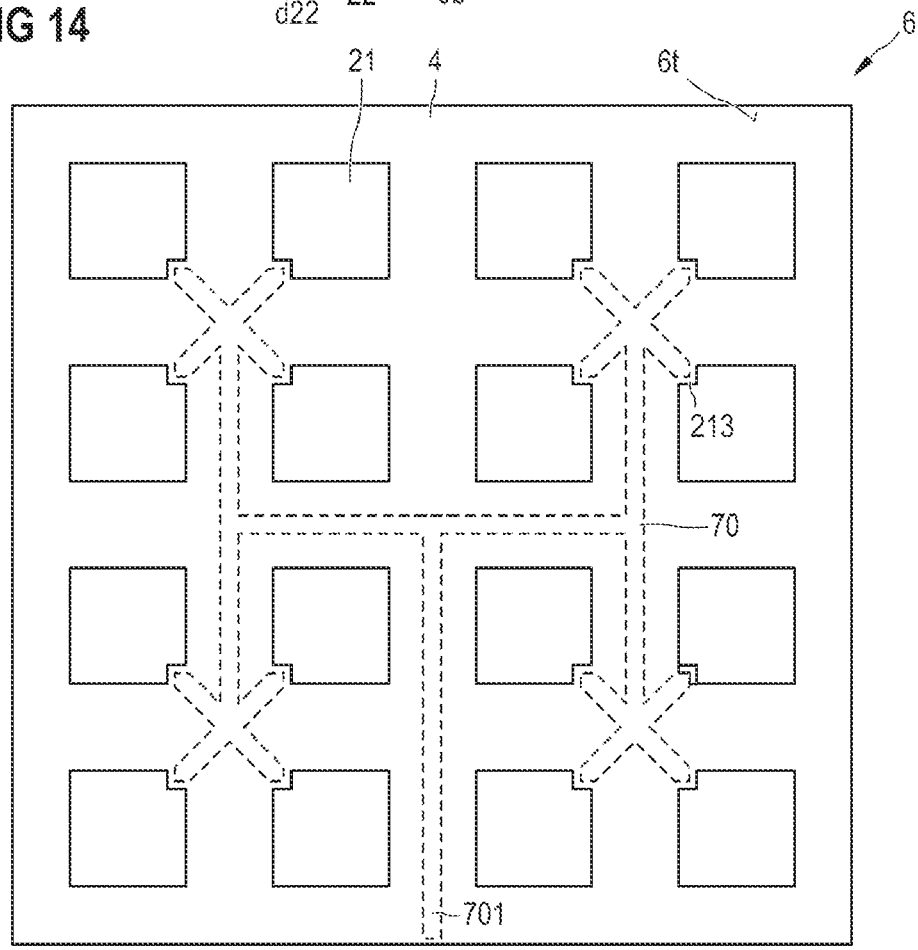

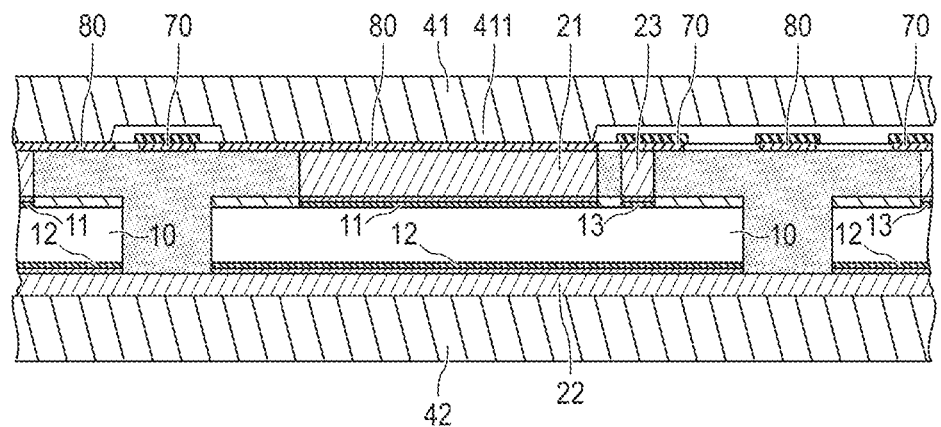
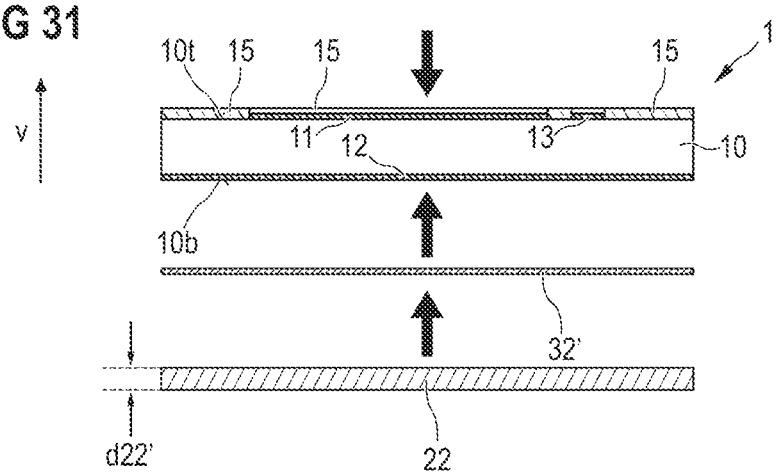
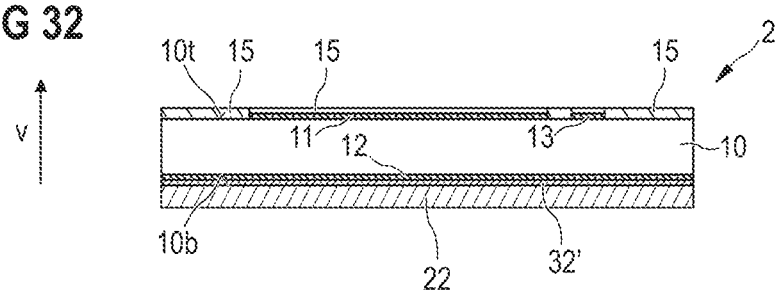

CHIP ASSEMBLAGE, PRESS PACK CELL AND METHOD FOR OPERATING A PRESS PACK CELL

CROSS REFERENCE TO RELATED APPLICATION

This Utility Patent Application claims priority to German Patent Application No. 10 2014 115 909.8, filed Oct. 31, 2014; and which is incorporated herein by reference.

BACKGROUND

The present invention relates to a chip assemblage which can be used in a press pack cell, and to a press pack cell as such, and to a method for operating a press pack cell.

In conventional press pack cells, semiconductor chips are pressed between two electrically conductive pressure contact pieces and are electrically contacted and electrically connected in parallel in the process. If the semiconductor chips each contain a controllable semiconductor switch, the semiconductor chips additionally comprise a control electrode. During the operation of the press pack cell, a drive voltage is fed to the latter, wherein the electrical potential of one of the pressure contact pieces is used as reference potential. Since a strong electric current flows via the relevant pressure contact piece during the operation of the press pack cell, a voltage drop occurs, whereby the control voltage present at the individual semiconductor chips can differ significantly from the drive voltage fed to the press pack cell. This can lead, for example, to temporal switching delays when the semiconductor switches are switched on or off. Therefore, there is a need to provide an improved solution to the stated problem.

This problem is solved by means of a chip assemblage as claimed in patent claim 1, and by means of a press pack cell as claimed in patent claim 13, and by means of a method for operating a press pack cell as claimed in patent claim 17. Dependent claims relate to configurations and developments of the invention.

BRIEF DESCRIPTION OF THE DRAWINGS

The invention is explained in greater detail below on the basis of exemplary embodiments with reference to the accompanying figures. In the figures, identical reference signs designate identical or identically acting elements. In the figures:

FIGS. 1 to 17 illustrate a method for producing a chip assemblage wherein a control electrode interconnection structure embodied as a leadframe is embedded into an embedding compound that connects a plurality of semiconductor chips to one another, and wherein a main electrode interconnection structure is arranged on the surface of the assemblage between the semiconductor chips and the embedding compound.

FIG. 30 illustrates a vertical section through a portion of a press pack cell including a chip assemblage embodied in accordance with FIGS. 28 and 29.

FIGS. 31 to 41 illustrate a method for producing a chip assemblage wherein the control electrode interconnection structure and the main electrode interconnection structure are embodied as conductor tracks of a structured metallization layer that was applied to the surface of an assemblage wherein a plurality of semiconductor chips are fixedly connected by an embedding compound.

DETAILED DESCRIPTION OF THE DRAWINGS

Figure 4:
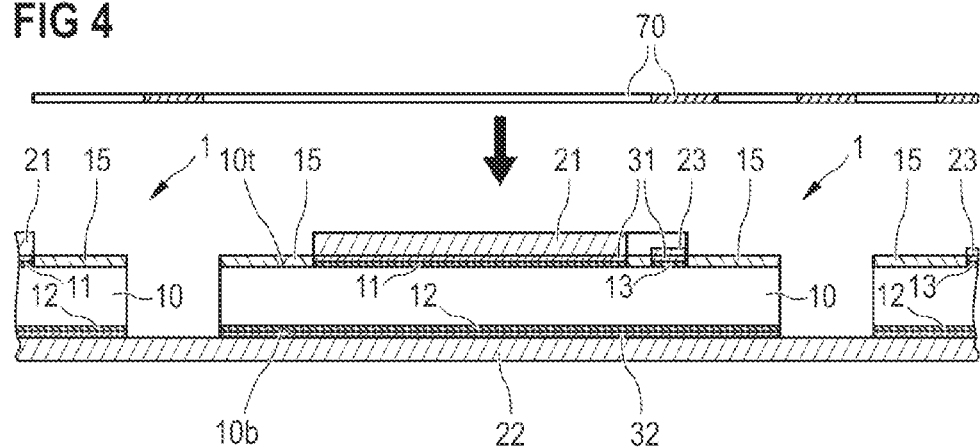

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

A first aspect relates to a chip assemblage having a number of semiconductor chips. Each of the semiconductor chips includes a semiconductor body having an underside, and also having a top side, which is spaced apart from the underside in a vertical direction. Moreover, each of the semiconductor chips includes a top main electrode arranged on the top side, a bottom main electrode arranged on the underside, and a control electrode, by means of which an electric current between the top main electrode and the bottom main electrode can be controlled. The semiconductor chips are cohesively connected to one another by a dielectric embedding compound to form a solid assemblage. The chip assemblage also includes a common control terminal, and a control electrode interconnection structure, which electrically conductively connects the control terminal to each of the control electrodes. Moreover, the chip assemblage includes a common reference potential terminal, and a main electrode interconnection structure, which electrically conductively connects the reference potential terminal to each of the first main electrodes. In this case, a dedicated, electrically conductive top compensation lamina is present for each of the semiconductor chips, said top compensation lamina being arranged on that side of the top main electrode which faces away from the semiconductor body and being cohesively and electrically conductively connected to the top main electrode.

A second aspect relates to a press pack cell. The latter is produced using a chip assemblage embodied in accordance with the first aspect. The press pack cell additionally includes an electrically conductive top contact plate and an electrically conductive bottom contact plate. The chip assemblage is arranged between the top contact plate and the bottom contact plate in such a way that the first main electrodes are situated at that side of the respective semiconductor chip which faces the top contact plate, and the second main electrodes are situated at that side of the respective semiconductor chip which faces the bottom contact plate.

A third aspect relates to a method for operating a press pack cell. For this purpose, a press pack cell embodied in accordance with the second aspect is provided. An electrically conductive top pressure contact piece and an electrically conductive bottom pressure contact piece are likewise provided. The press pack cell is clamped in between the top pressure contact piece and the bottom pressure contact piece in such a way that there is a pure electrical pressure contact between the top pressure contact piece and the top contact plate, and that there is a pure electrical pressure contact between the bottom pressure contact piece and the bottom contact plate. The top pressure contact piece and the bottom pressure contact piece are connected to an electrical voltage source, such that different electrical potentials are present at the top pressure contact piece and the bottom pressure contact piece. In addition, a control voltage is connected between the reference potential terminal and the control terminal.

FIG. 1 illustrates a semiconductor chip 1 and further parts for producing an intermediate product such as is illustrated in FIG. 3. The semiconductor chip 1 includes a semiconductor body 10 composed of a basic semiconductor material, in which, in particular, p-conducting and n-conducting semiconductor zones can be contained in order to realize a power semiconductor component integrated into the semiconductor body 10. Moreover, the semiconductor chip 1 can also have as many electrically conductive layers as desired such as, for example, metallizations, silicide layers or layers composed of doped polycrystalline semiconductor material (e.g. polycrystalline silicon), but also as many dielectric layers as desired such as, for example, nitride layers (e.g. silicon nitride), or oxide layers (e.g. silicon oxide), or passivation layers such as e.g. imide layers. The basic semiconductor material can be any known basic semiconductor material that is customary for producing semiconductor components, for example arbitrary elemental semiconductors (e.g. silicon, germanium), arbitrary compound semiconductors (e.g. II-VI semiconductors such as zinc selenide or cadmium sulfide, III-V semiconductors such as gallium phosphide, gallium arsenide, indium phosphide, indium antimonide, or IV-IV semiconductors such as silicon carbide or silicon-germanium).

The semiconductor body 10 has a top side 10$t$, and also an underside 10$b$ opposite the top side. The top side 10$t$ is spaced apart from the underside 10$b$ in a vertical direction v, wherein the vertical direction v runs perpendicularly to the underside 10$b$. A top main electrode 11 is arranged on the top side 10$t$, and a bottom main electrode 12 is arranged on the underside 10$b$. A control electrode 13 is likewise situated on the top side 10$t$. Furthermore, an optional top dielectric passivation layer 15 can be applied to the top side 10$t$. This passivation layer 15 can be a polyimide, for example.

The top main electrode 11, the bottom main electrode 12 and the control electrode 13 can be thin metallization layers, for example. Such metallization layers can be applied to the semiconductor body 10 for example as early as during the production of the semiconductor chip 1 in the wafer assemblage with further, identical semiconductor chips 1, that is to say before the wafer has been singulated to form mutually independent semiconductor chips 1.

As is illustrated in FIG. 2, a plurality of such semiconductor chips 1 are mounted jointly and in a manner spaced apart from one another on an electrically conductive bottom compensation lamina 22 by virtue of the fact that they are cohesively and electrically conductively connected to the bottom compensation lamina 22 in each case at their bottom main electrode 12 by means of a bottom connecting layer 32. The bottom compensation lamina 22 is then situated on that side of the bottom main electrode 12 which faces away from the semiconductor body 10.

Before, simultaneously with or—as illustrated in the present case—after the mounting of the semiconductor chips 1 on the bottom compensation lamina 22, each semiconductor chip 1 is cohesively provided with a dedicated, electrically conductive top compensation lamina 21 by virtue of the top compensation lamina 21 being cohesively connected to the top main electrode 11 by means of a top connecting layer 31. The top compensation lamina 21 is then situated on that side of the top main electrode 11 of the relevant semiconductor chip 1 which faces away from the semiconductor body 10 of said semiconductor chip.

An electrically conductive contact piece 23 can optionally also be fitted on the control electrode 13 of each of the semiconductor chips 1, which contact piece is cohesively and electrically conductively connected to the control electrode 13 by means of the top connecting layer 31. If such a contact piece 23 is provided, the adjacent top compensation lamina 21 can have a cutout 213 (FIG. 1), in which the contact piece 23 is positioned.

The compensation laminae 21 and 22 serve, in particular, to reduce mechanical stresses which occur if such a compensation lamina 21, 22 is subjected to pressure contact-connecting by a contact plate 41 and respectively 42 (e.g. composed of copper), which will be explained later, said contact plate having a coefficient of thermal expansion which is greatly different from the coefficient of thermal expansion of the semiconductor body 10. In the absence of compensation laminae 21, 22, the contact plates 41 and 42 would make contact directly with the very thin main electrodes 11 and 12, respectively. On account of the thermomechanical stresses arising here, in the best case the electrical properties of the semiconductor chip 1 would vary; in the worst case, the semiconductor chip 1 can also crack.

The compensation laminae 21 and 22 have (before mounting on the top main electrode 11 and the bottom main electrode 12, respectively, and directly after mounting) relatively large thicknesses d21' and d22', respectively, in the vertical direction v—independently of one another and in arbitrary combinations with one another—for example at least 0.5 mm, at least 1 mm, or at least 1.5 mm. The large thicknesses are intended to prevent damage to the main electrodes 11 and 12 if the compensation laminae 21 and/or 22 are ground, as will be explained later.

Optionally, the top compensation laminae 21 and/or the bottom compensation lamina 22 can in each case have a coefficient of linear thermal expansion that is significantly lower than the coefficient of linear thermal expansion of the contact plates 41, 42, yet to be described, in order to achieve an adaptation of a high coefficient of linear thermal expansion of the contact plates 41, 42 to the low coefficient of linear thermal expansion of the semiconductor body 10. By way of example, the top compensation laminae 21 and/or the bottom compensation lamina 22, at a temperature of 20° C., can have a coefficient of linear thermal expansion of less than 11 ppm/K or even of less than 7 ppm/K. In this case, the top compensation lamina 21 and/or the bottom compensation lamina 22 can for example consist of one of the following materials, comprise one of the following materials or have one of the following constructions: molybdenum; a metal matrix composite material (MMC), for example AlSiC (aluminum silicon carbide); a multi-layer material comprising two or more metal layers, for example a three-layer material having the layer sequence copper-molybdenum-copper (Cu—Mo—Cu), e.g. having layer thicknesses in the ratio of 1:4:1, which produces a coefficient of expansion of the Cu—Mo—Cu three-layer material of approximately 7.3 ppm/K.

The top connecting layers 31 can be embodied for example as arbitrary solder layers, in particular also as diffusion solder layers, as sintered layers containing a sintered metal powder (e.g. silver powder or silver flakes), or as an electrically conductive adhesive layer. Independently thereof, the bottom connecting layer 32 can also be embodied as an arbitrary solder layer, in particular also as a diffusion solder layer, as a sintered layer containing a sintered metal powder (e.g. silver powder or silver flakes), or as an electrically conductive adhesive layer. The top connecting layer 31 and the bottom connecting layer 32 can consist of the same material, in particular; however, it is also possible to use arbitrary combinations of the materials mentioned for the two layers.

In FIG. 1, the starting materials used for producing the top connecting layer 31 and the bottom connecting layer 32 are designated by 31' and 32', respectively. This is intended to express the fact that the original connecting means 31' and 32' can be present in an altered form after the connection has been produced.

In the case of a starting material 31', 32' embodied as solder (for example a tin-containing solder), the resulting connecting layer 31 and 32, respectively, can contain a material (e.g. copper) which diffused into the solder from the top main electrode 11 and the bottom main electrode 12, respectively, during the connection process and thus constitutes a constituent of the finished connecting layer 31 and 32, respectively. In order to produce the connections, the solder 31', 32' can be applied in the form of a solder paste, for example, to the main electrodes 11, 12 and/or to the compensation laminae (for example by screen or stencil printing). Likewise, however, the solder 31', 32' can also be introduced in the form of a prefabricated solder lamina ("preform solder") respectively between the top compensation lamina 21 and the top main electrode 11 of the relevant semiconductor chip 1 and between the bottom compensation lamina 22 and the bottom main electrodes 12. In any case the solder paste or the solder lamina/laminae for producing the connections explained are melted and subsequently cooled, such that a cohesive connection in each case arises between the top compensation lamina 21 and the top main electrode 11 and respectively between the bottom compensation lamina 22 and the bottom main electrode 12.

In the case of a connecting layer 31 and 32 embodied as a sintered layer, the starting material 31' and 32', respectively, on which said layer is based can be embodied as a paste containing a metal powder (e.g. silver powder or silver flakes) and a solvent. In order to produce the connections, the paste can be applied, for example, to the main electrodes 11, 12 and/or to the compensation laminae 21, 22 (for example by screen or stencil printing). A paste layer formed from the paste is then arranged in each case between the top main electrode 11 and the top compensation lamina 21 and makes contact with each of them. Correspondingly, a further paste layer formed from the paste is arranged between the bottom main electrodes 12 and the bottom compensation lamina 22 and makes contact with each of them. In this state, the paste layers are dried by evaporation of the solvent contained therein and are then sintered, wherein the sintering can be carried out at temperatures of significantly less than 250° C. As a result of the sintering, the (electrically conductive) top connecting layers 31 and respectively the (electrically conductive) bottom connecting layers 32 are formed from the two paste layers.

In the case of a connecting layer 31 and 32 embodied as an electrically conductive adhesive layer, the starting material 31' and 32', respectively, on which said layer is based is embodied as an electrically conductive adhesive. In order to produce the connections, the adhesive can be applied, for example, to the main electrodes 11, 12 and/or to the compensation laminae 21, 22 (for example by screen or stencil printing). A top adhesive layer formed from the adhesive is in each case arranged between the top main electrode 11 and the top compensation lamina 21 and makes contact with each of them. As a result of the subsequent curing, the electrically conductive top connecting layers 31 form from the top adhesive layers. Correspondingly, bottom adhesive layers formed from an adhesive are arranged between the bottom main electrodes 12 and the bottom compensation lamina 22 and make contact with each of them. As a result of the subsequent curing, the electrically conductive bottom connecting layers 32 form from the bottom adhesive layers.

If an optional contact piece 23 is provided, it can be cohesively connected to the control electrode 13 by means of any of the connecting techniques such as have already been explained for the connection between the top compensation laminae 21 and the top main electrodes 11, to be precise independently of the connecting techniques chosen for the connections between the top compensation laminae 21 and the top main electrode 11.

As is furthermore illustrated in vertical section in FIG. 4, then a control electrode interconnection structure 70 is provided. The latter is an electrically conductive structure that serves to electrically conductively connect the control electrodes 13 of the semiconductor chips 1 to one another, and to a terminal location; the same control signal can be fed via all control electrodes 13. In the case of the configuration in accordance with FIG. 4, the control electrode interconnection structure 70 is embodied merely by way of example as a metallic leadframe. Other configurations are likewise possible, however, as long as the explained purpose is achieved thereby.

Figure 5:
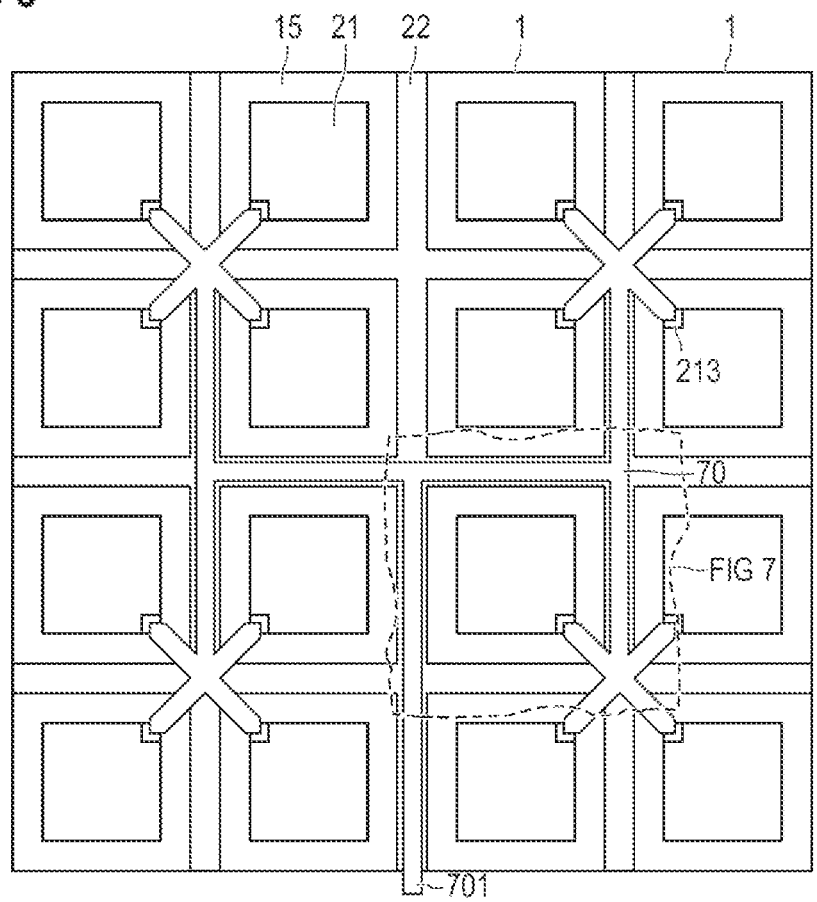

FIG. 5 is a plan view of the entire arrangement wherein, merely by way of example, 16 semiconductor chips 1 are arranged in the form of a 4×4 matrix alongside one another on the bottom compensation lamina 22, after the control electrode interconnection structure 70 has been electrically conductively and cohesively connected to the control electrodes 13 of the semiconductor chips 1. FIG. 6 illustrates a vertical section corresponding to FIG. 4 after the control electrode interconnection structure 70 has been electrically conductively and cohesively connected to the control electrodes 13 of the semiconductor chips 1. The electrically conductive connections can be produced once again using connecting layers such as have already been explained above for the top or bottom connecting layers 31, 32 (that is to say e.g. soldering, diffusion soldering, sintering, adhesive bonding). The connecting layers arranged respectively between a control electrode 13 and the control electrode interconnection structure 70 are not illustrated in detail in FIG. 6, for reasons of clarity.

As can furthermore be gathered from FIG. 5, in each case four of the semiconductor chips 1 can be arranged in a 2×2 matrix alongside one another on the bottom compensation lamina 22 in such a way that the control electrodes 13 (hidden by the control electrode interconnection structure 70 in FIG. 5; they are situated in each case in a cutout 213 of a top compensation lamina 21) are situated in each case at the mutually facing corners of the four semiconductor chips 1. An enlarged portion of the view in accordance with FIG. 5 is illustrated in FIG. 7.

Figure 8:
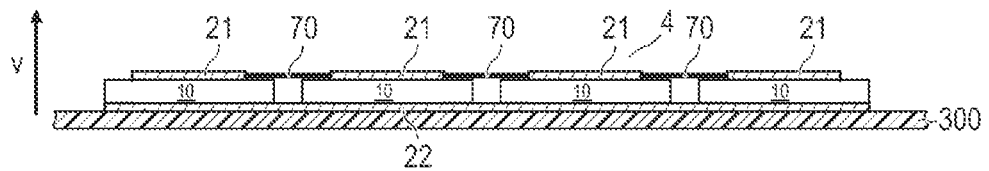

After or before the cohesive connection of the control electrode interconnection structure 70 to the control electrodes 13, optionally as early as before the mounting of the top compensation laminae 21 on the semiconductor chips 1 or even before the mounting of the semiconductor chips 1 on the bottom compensation lamina 22, the bottom compensation lamina 22, for the purpose of further processing temporarily, if appropriate with the semiconductor chips 1 already cohesively connected thereto and/or with the top compensation laminae 21 cohesively connected to the semiconductor chips 1, can be fixed on an auxiliary carrier 300. For this purpose, the auxiliary carrier 300 can have an adhesive surface, for example. A double-sided adhesive film can also be used, by means of which the bottom compensation lamina 22 is adhesively bonded to the auxiliary carrier 300. FIG. 8 illustrates the bottom compensation lamina 22 equipped with the semiconductor chips 1 and arranged on the auxiliary carrier 300. In addition, the control electrodes of the semiconductor chips 1 are electrically conductively connected by the control electrode interconnection structure 70. As a result, the top compensation laminae 21 are situated in each case on that side of the relevant semiconductor chip 1 which faces away from the auxiliary carrier 300, while the bottom compensation lamina 22 is arranged between the semiconductor chips 1, on the one hand, and the auxiliary carrier 300, on the other hand.

Figure 9:
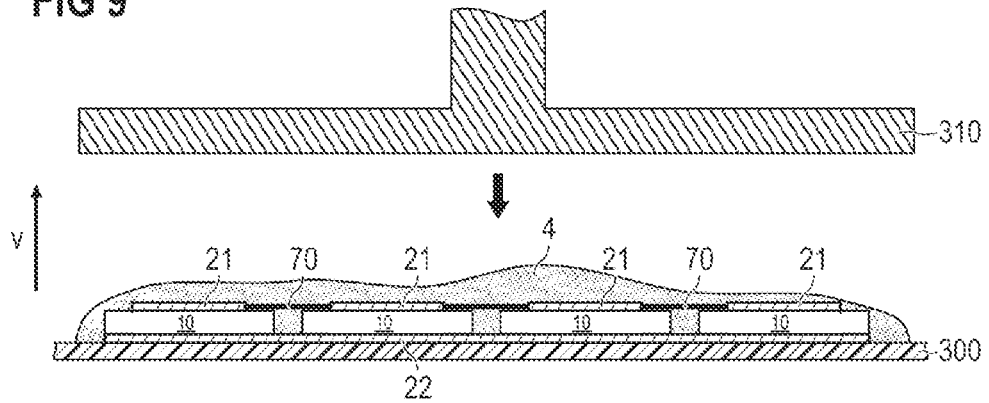
Figure 10:
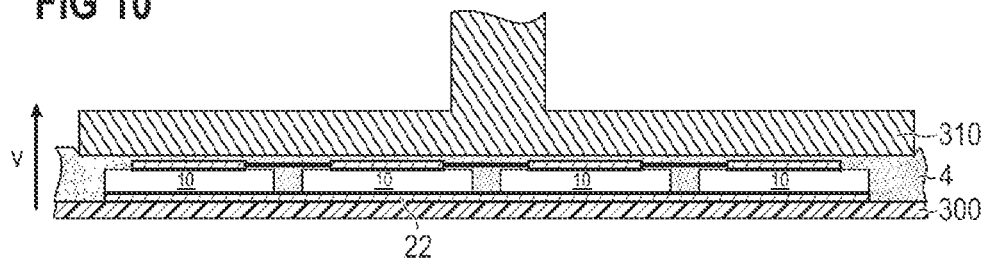

As is furthermore illustrated in FIG. 9, a viscous embedding compound 4 is then applied over the semiconductor chips 1 situated on the carrier 300 and provided with the top compensation laminae 21. The embedding compound 4 is then pressed against the carrier 300 by means of a stamp 310, such that at least the interspaces situated between respectively adjacent semiconductor chips 1 are filled with the embedding compound 4. For this purpose, a stamp 310 can press against the embedding compound 4 from those sides of the semiconductor chips 1 and of the embedding compound 4 which face away from the auxiliary carrier 300, in order to distribute the embedding compound 4 uniformly over the semiconductor chips 1 and in the process to fill the interspaces situated between the semiconductor chips 1 with the embedding compound 4, the result of which is illustrated in FIG. 10.

The embedding compound 4 is then cured, such that the semiconductor chips 1 embedded into the embedding compound 4 together with the embedding compound 4 form a solid assemblage. The semiconductor chips 1 are therefore fixedly connected to one another by the embedding compound 4. The embedding compound 4 is dielectric at least in the cured state. Examples of a suitable embedding compound 4 include polycondensed polymers (e.g. an epoxy resin or a polyurethane-based potting material). In principle, however, for all configurations of the invention, any embedding compounds 4 can be used, provided that they are dielectric in the cured state. In particular, an embedding compound 4 according to the present invention can be formed from a homogeneous material or a homogeneous material mixture.

Figure 11:
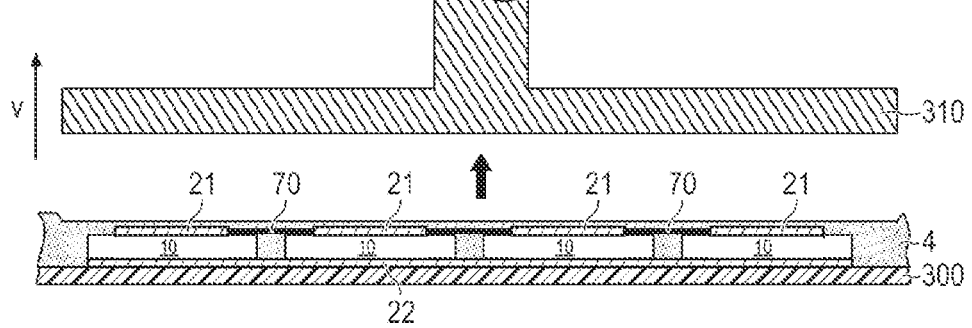

As is furthermore illustrated in FIG. 11, the stamp 310 can be lifted off from the solid assemblage after the curing of the embedding compound 4. Moreover, the assemblage can be removed from the auxiliary carrier 300 and be trimmed at the lateral edges by the removal of excess embedding compound 4, such that a residual assemblage 5 remains, which is illustrated as the result in FIG. 12. Even after the trimming, the embedding compound 4 has the effect that the semiconductor chips 1 are fixedly and cohesively connected to one another.

The assemblage 5 can then be ground, such that the remaining residual assemblage 6, as is illustrated as the result in FIG. 13, has plane-parallel top sides and undersides 6t and 6b, respectively. After grinding, each of the (slightly ground) top compensation laminae 21 is exposed at the top side 5t, such that they can be electrically contacted. The control electrode interconnection structure 70 is embedded into the embedding compound 4, i.e. the control electrode interconnection structure 70 is covered by a cover layer formed from the embedding compound 4. In any case, even after the grinding, the embedding compound 4 ensures that the semiconductor chips 1 are fixedly and cohesively connected to one another. The grinding can be carried out for example by the machining (grinding, polishing, lapping, etc.) of the assemblage in a conventional wafer grinding installation.

As a result of the grinding, the thicknesses d21 of the top compensation laminae 21 are slightly reduced compared with their original thicknesses D21' (see FIG. 1), for example by approximately 0.1 mm. However, the reduced thickness d21 can still be, for example, at least 0.4 mm, at least 0.9 mm, or at least 1.4 mm. Moreover, the thickness d22 of the bottom compensation lamina 22 can be reduced by the grinding compared with its original thickness d22' (see FIG. 1), for example by approximately 0.1 mm. However, the reduced thickness d22 can still be, for example, at least 0.4 mm, at least 0.9 mm, or at least 1.4 mm.

FIG. 14 illustrates a plan view of the top side 5t of the residual assemblage 6 with the top compensation laminae 21 exposed in the embedding compound 4. The control electrode interconnection structure 70 embedded into the embedding compound 4 and hidden by the latter is illustrated with the aid of a dashed line. A terminal location 701 of the control electrode interconnection structure 70 serves later as a terminal location for the joint electrical contacting of the control electrodes 13. The terminal location thus constitutes a common control terminal of the control electrodes.

As is furthermore illustrated in FIG. 15, a thin, electrically conductive connecting layer 80 can also be applied to the top side 5t of the residual assemblage 6, said connecting layer electrically conductively connecting the top compensation laminae 21 to one another and therefore also being referred to hereinafter as "main electrode interconnection structure".

Figure 15:
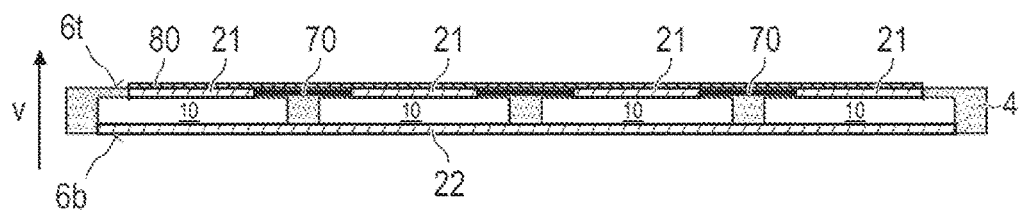
Figure 16:
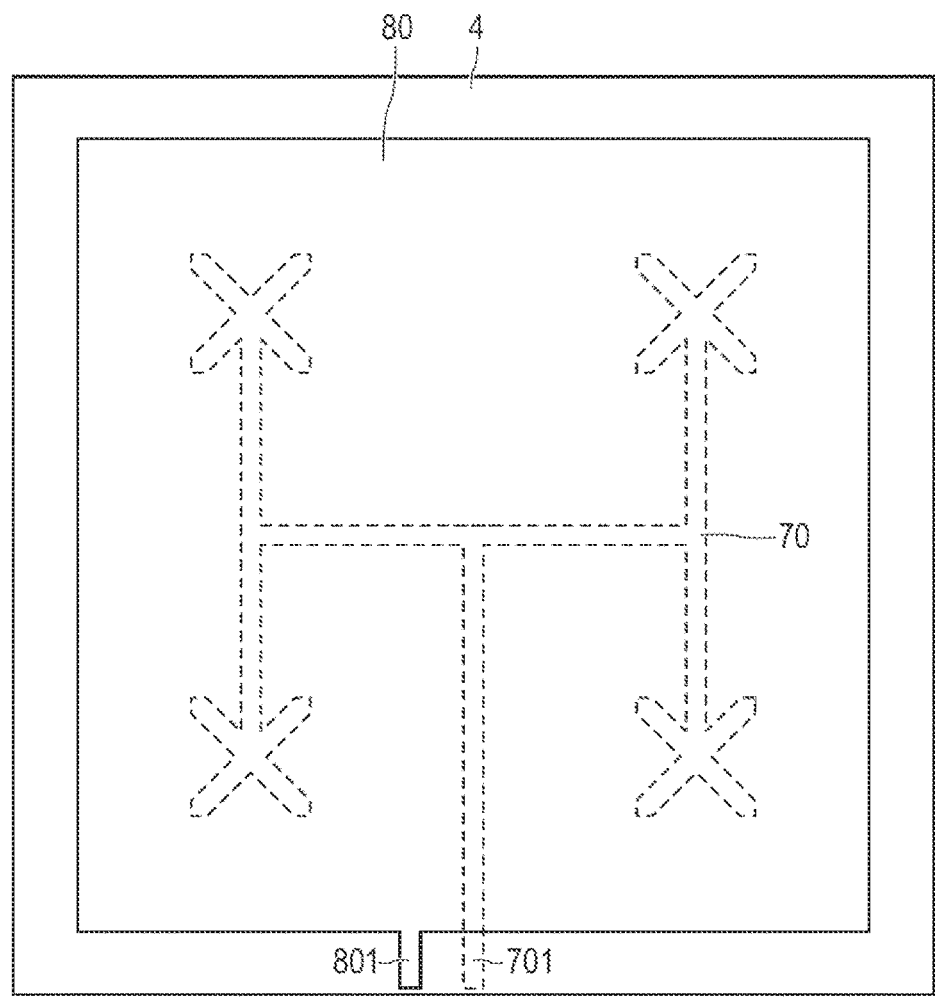
Figure 17:
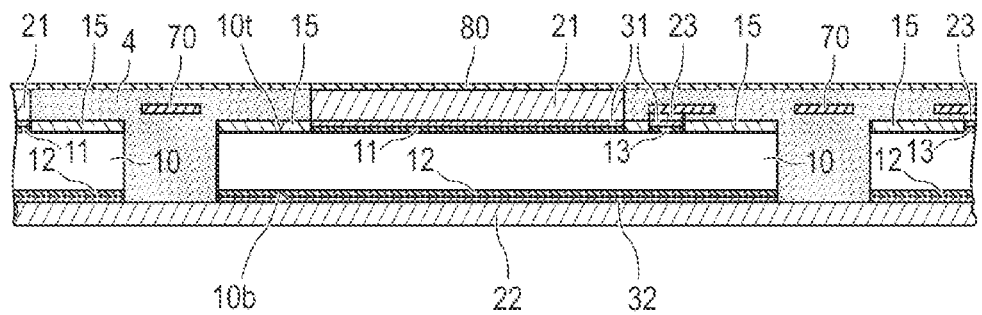

An enlarged portion of the chip assemblage in accordance with FIG. 15 is illustrated in FIG. 17. FIG. 16 illustrates a plan view of the arrangement in accordance with FIG. 15 with a view of the electrically conductive connecting layer 80. The connecting layer 80 can be embodied using thin-film technology, for example, by being deposited on the top side 5t by means of a deposition method, for example PVD (=physical vapor deposition, e.g. sputtering), CVD (=chemical vapor deposition) or plating. The connecting layer 80 can for example comprise ruthenium or consist of ruthenium, and/or it can e.g. comprise aluminum or consist of aluminum. The connecting layer 80 additionally serves as a sliding medium during the pressure contacting, which will be explained later, in order to reduce the mechanical stresses that typically arise during the pressure contacting and thus to avoid cracking in the chip assemblage.

The connecting layer 80 can furthermore be provided with a terminal location 801 that serves later as an auxiliary electrode terminal location at which the electrical potential of the top main electrodes 21 is present to a good approximation. The terminal location 801 thus forms a terminal location for a reference potential for driving the semiconductor chips 1.

Figure 18:
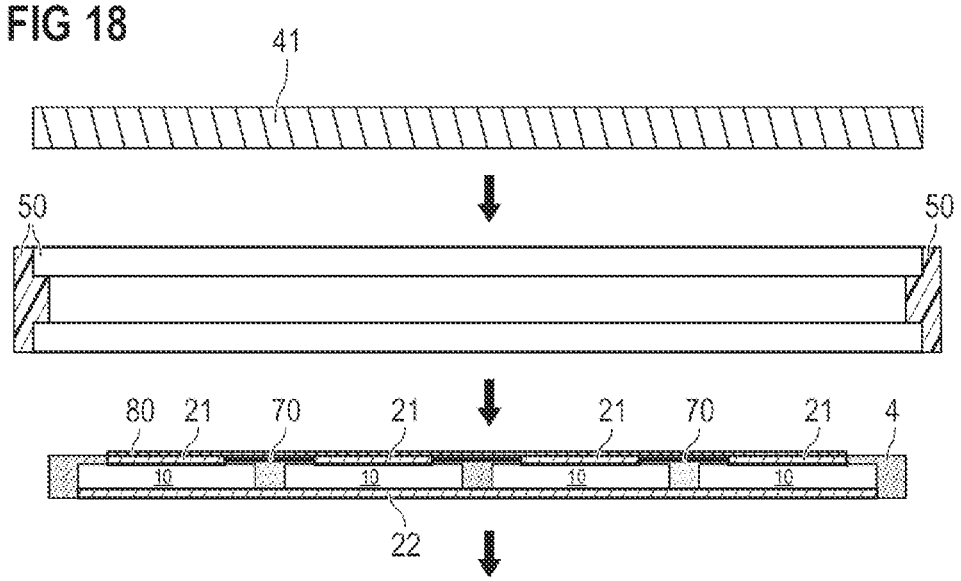
FIGS. 18 to 20 illustrate a method for producing a press pack cell wherein a chip assemblage is arranged between two electrically conductive contact plates of a housing.
Figure 19:
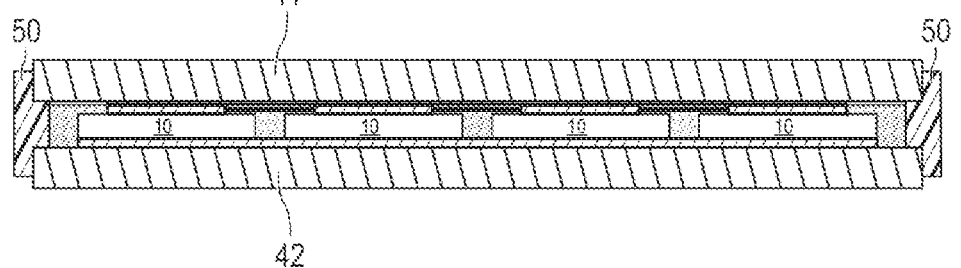

Using a ground residual assemblage 6 comprising two or more (optionally identical) semiconductor chips 1, it is possible, then, to produce a semiconductor arrangement such as is illustrated as the result in FIG. 19. FIG. 18 illustrates an exploded illustration of the finished semiconductor arrangement in accordance with FIG. 19. As is evident from FIGS. 18 and 19, the semiconductor arrangement includes an electrically conductive top contact plate 41, an electrically conductive bottom contact plate 42, and also a dielectric spacer ring 50. The ground residual assemblage 6 provided with the connecting layer 80 is arranged between the top contact plate 41 and the bottom contact plate 42. The top contact plate 41 serves for electrically and mechanically contacting, from each of the semiconductor chips 1, the top compensation lamina 21 facing the top contact plate 41. The bottom contact plate 42 correspondingly serves for electrically and mechanically contacting the bottom compensation lamina 22. The electrical contacting here can be pure pressure contacting in each case.

Suitable materials for the top contact piece 41 and/or the bottom contact piece 42 include copper or a copper alloy, for example. Optionally, the top contact piece 41 and/or the bottom contact piece 42 can be provided with a thin nickel layer. In principle, however, use can also be made of any other electrically conductive materials, in particular metals or metal alloys, for example aluminum or an aluminum alloy or a copper alloy.

The spacer ring 50, which is arranged between the contact plates 41 and 42 and which surrounds the assemblage 5 in a ring-shaped manner, consists of a dielectric material, for example ceramic, in order to electrically insulate the contact plates 41 and 42 from one another. As also in all of the other configurations of the invention, the spacer ring 50 can be connected cohesively, for example by soldering, adhesive bonding or sintering, both to the top contact plate 41 and to the bottom contact plate 42. The contact plates 41 and 42 together with the spacer ring 50 form a housing in which the semiconductor chips 1 fixedly connected to one another by the embedding compound 4, the control electrode interconnection structure 70 and the connecting layer 80 are arranged.

Figure 20:
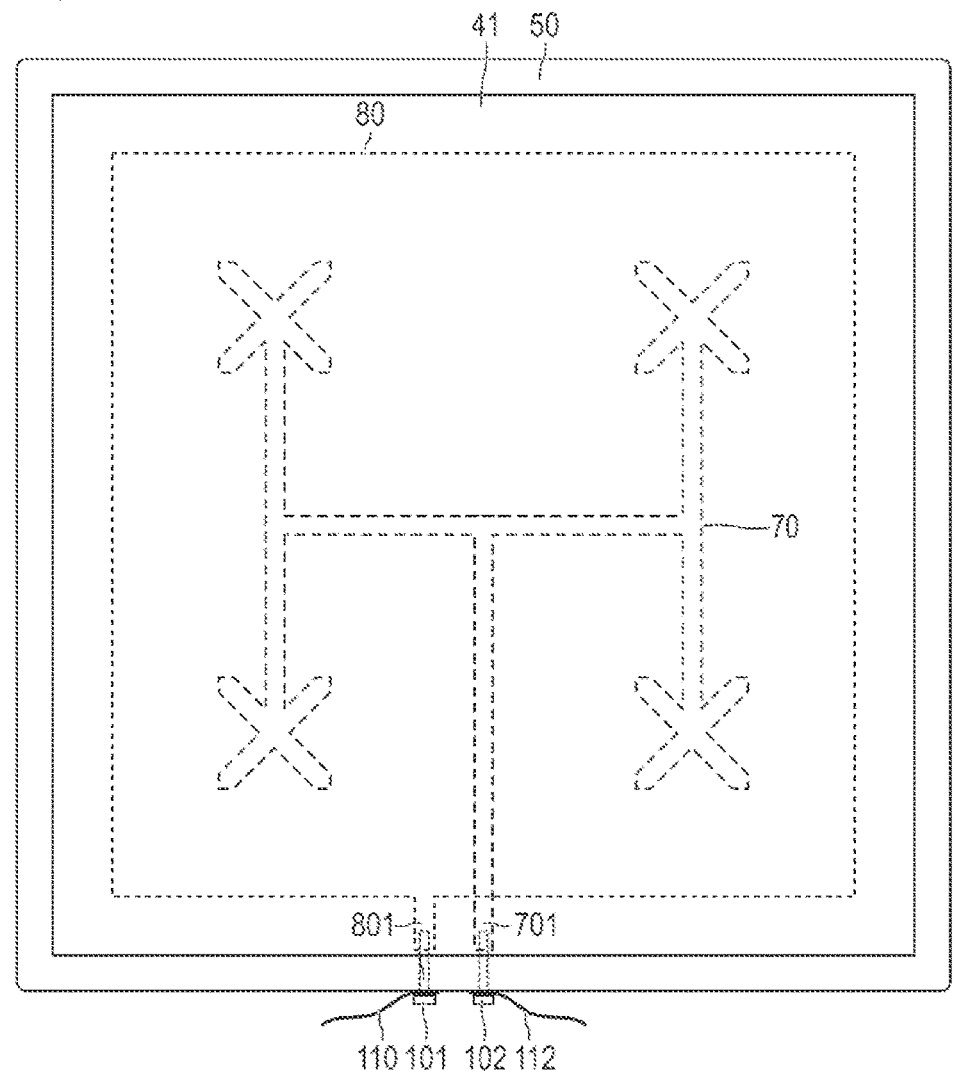

FIG. 20 illustrates a plan view of the arrangement in accordance with FIG. 19. The courses of the electrically conductive connecting layer 80 and of the control electrode interconnection structure 70 are illustrated by dashed lines in each case. The electrical terminal locations 801 and 701 can be electrically contacted from outside the completed semiconductor arrangement. For this purpose, by way of example, a first terminal contact 101 and a second terminal contact 102 can be introduced through a common or through a respective through opening or groove, formed in the spacer ring 50, from the outer side of the spacer ring 50 into the inner region thereof and can make electrical contact with the terminal locations 801 and 701, respectively.

In order to realize the electrical connection between the first terminal contact 101 and the connecting layer 80, the first terminal contact 101 can have a contact spring, for example, which is pressed resiliently onto the terminal location 801. As an alternative or in addition to pressing, however, the first terminal contact 101 can also be connected to the terminal location 801 cohesively, for example by soldering, electrically conductive adhesive bonding or by means of a sintered connection. It is likewise possible for the first terminal contact 101, as illustrated, to be embodied as a screw and to be screwed into the assemblage in such a way that it makes electrical contact with the terminal location 801. In any case, as a result, there is an electrically conductive connection between the first terminal contact 101 and the terminal location 801 and thus also between the first terminal contact 101 and the first load terminals 11 of the semiconductor chips 1.

The realization of the electrical connection between the second terminal contact 102 and the control electrode interconnection structure 70 can be effected in one of the same ways as explained for the realization of the electrical connection between the first terminal contact 101 and the connecting layer 80. If the connecting technique here (like the variants "contact spring" or "cohesive connection") requires the terminal location 701 on the assemblage to be exposed, the control electrode interconnection structure 70 can be embodied such that it (in the case of a control electrode interconnection structure 70 embodied as a leadframe, for example, by means of a stepped bending of the leadframe), or a contact piece which is electrically conductively connected to it and which was concomitantly embedded into the embedding compound 4 is exposed after the grinding. The connecting technique for the electrical connection between the first terminal contact 101 and the connecting layer 80 and the electrical connection between the second terminal contact 102 and the control electrode interconnection structure 70 can be combined with one another in any desired manner. In any case, external electrical terminal lines 110 and 112 can be electrically conductively connected to the terminal locations 801 and 701, respectively.

Figure 21:
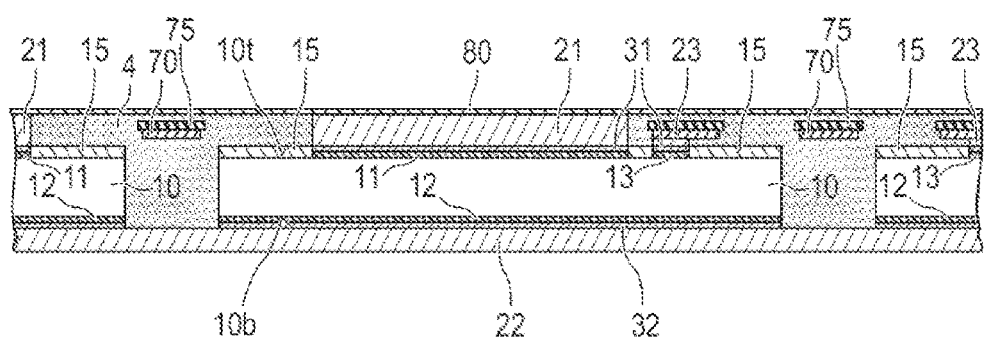
FIG. 21 illustrates a chip assemblage that differs from the chip assemblage in accordance with FIG. 17 merely in that the control electrode interconnection structure is not embodied as a leadframe, but rather as a conductive track of a prefabricated printed circuit board that is embedded into the embedding compound.

While the control electrode interconnection structure 70 in the previous example was a metallic leadframe, it is embodied as a metallization layer of a prefabricated printed circuit board (PCB) in the case of the chip assemblage in accordance with FIG. 21. As is illustrated in FIG. 21, the printed circuit board comprises a dielectric carrier layer 75, to which the control electrode interconnection structure 70 is applied in a planar manner in the form of a metallization layer. In this case, the control electrode interconnection structure 70 is arranged on that side of the dielectric carrier layer 75 which faces the bottom compensation lamina 22, such that it can be electrically conductively connected to the control electrodes 13 without any problems. For the rest, the production of an assemblage and the arrangement thereof in a housing having an electrically conductive top contact plate 41, an electrically conductive bottom contact plate 42 and a dielectric spacer ring 50 can be carried out in the same way as was explained on the basis of the example in accordance with FIGS. 1 to 20.

In the case of a further example explained with reference to FIGS. 22 to 26, a prefabricated printed circuit board (PCB) can supplementarily also be used for producing the electrically conductive connections between the first load terminals 11. The construction of the printed circuit board initially corresponds to the construction of the printed circuit board as explained in the case of the example in accordance with FIG. 21. In addition, the printed circuit board has, on the side of the dielectric carrier layer 75 which faces away from the metallization layer forming the control electrode interconnection structure 70, a main electrode interconnection structure 80, which includes a metallization layer of the printed circuit board, and also spring elements 85, which are electrically conductively (e.g. by soldering, etc.) connected to said metallization layer.

Figure 22:
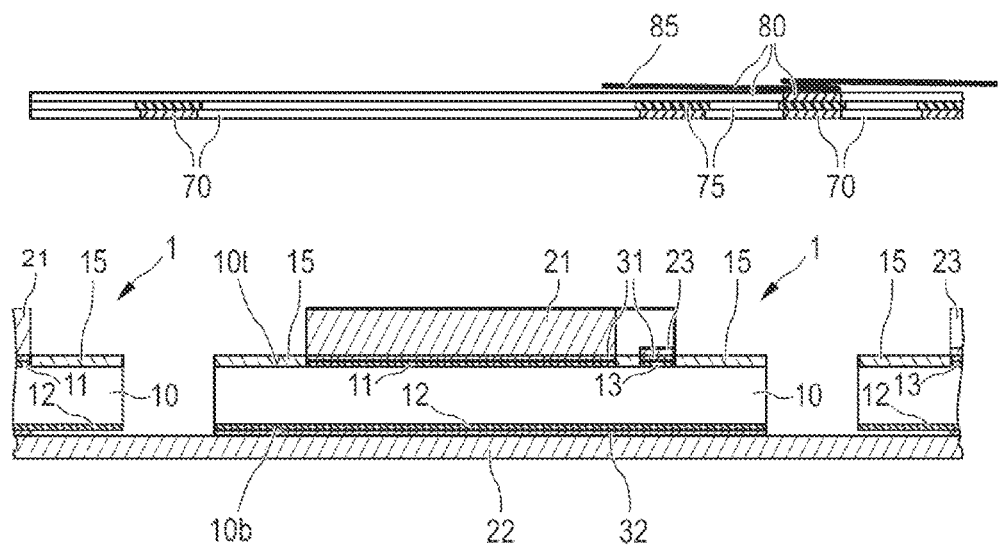
FIGS. 22 to 26 illustrate a method for producing a chip assemblage wherein the control electrode interconnection structure and the main electrode interconnection structure in each case include conductor tracks of a prefabricated printed circuit board that is embedded into the embedding compound, and wherein the main electrode interconnection structure additionally includes spring elements that bring about an electrically conductive connection between the main electrode interconnection structure and the first main electrodes of the semiconductor chips.

FIG. 22 illustrates, below the printed circuit board equipped with the spring elements 85, an arrangement whose construction corresponds to the arrangement and which can be produced in the same way as the arrangement explained below the leadframe 70 in FIG. 4.

Figure 23:
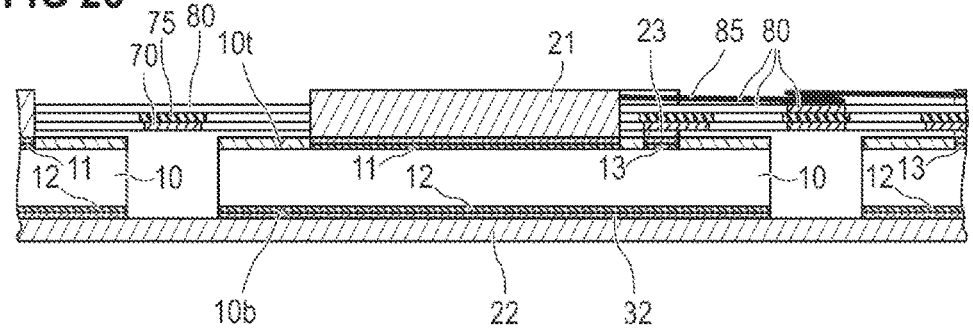
Figure 24:
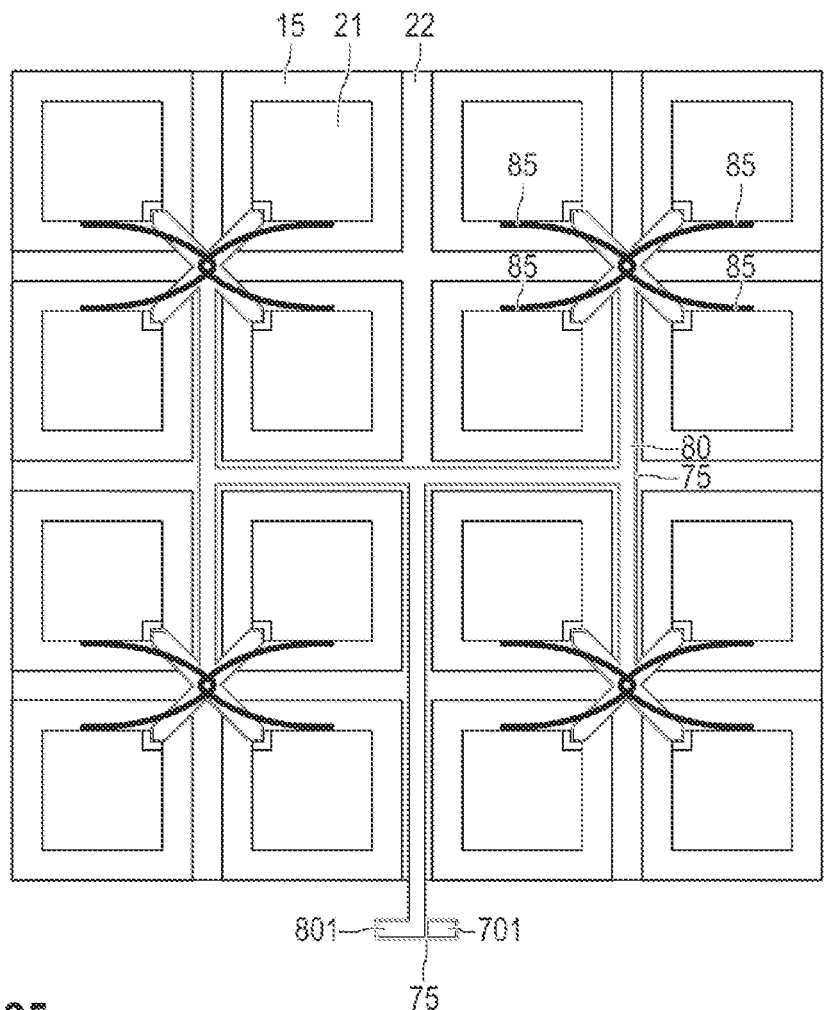

After the placement of the printed circuit board and the production of the electrically conductive connection between the control electrode interconnection structure 70 and the control electrodes 13 in accordance with the previous examples, an arrangement is present such as is illustrated by way of example in FIG. 23. During the placement of the printed circuit board, the spring elements 85 are prestressed, such that they respectively press against a side wall of a top compensation lamina 21 and electrically contact the latter. In this case, the pressing direction can run perpendicularly to the vertical direction v. FIG. 24 illustrates the arrangement in plan view with a plurality of spring elements 85.

Figure 25:
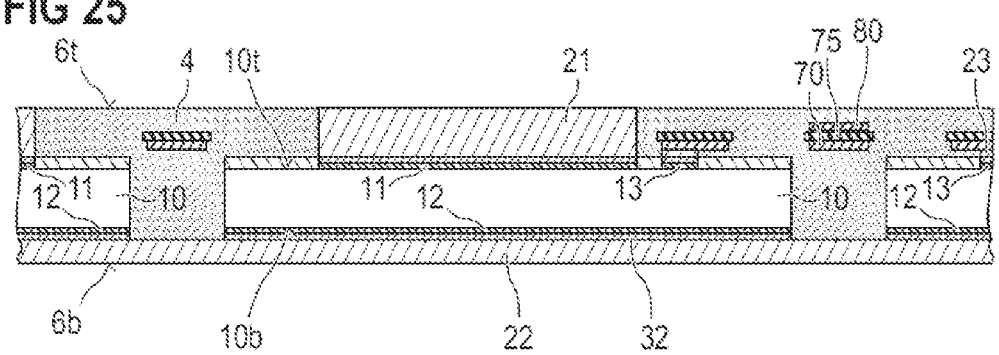
Figure 26:
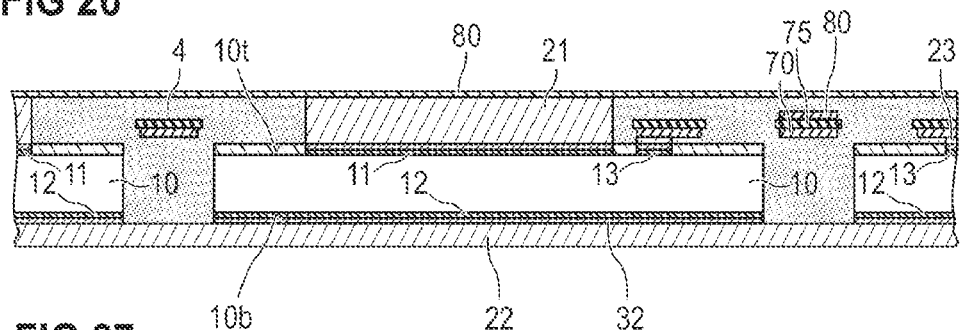
Figure 27:
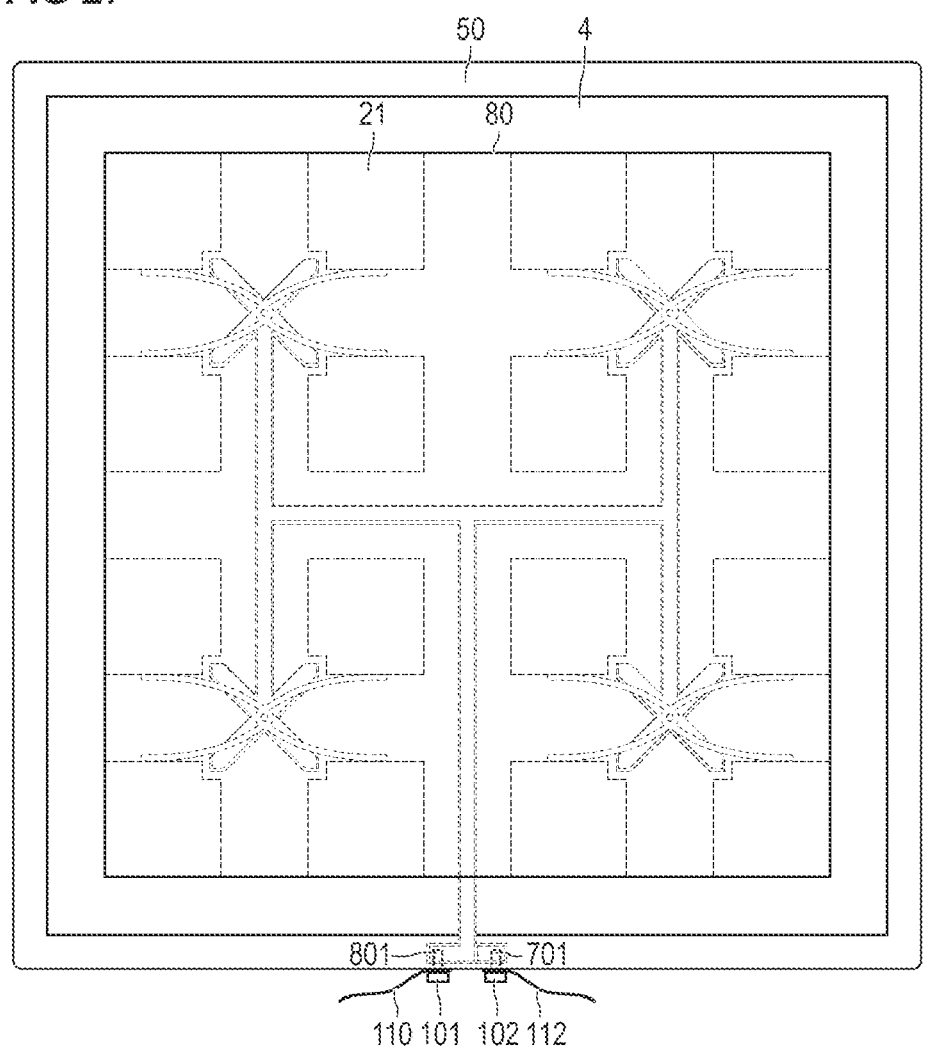
FIG. 27 illustrates a plan view of a press pack cell including a chip assemblage embodied in accordance with FIG. 26.

Afterward, the arrangement—as explained with reference to the previous figures—can be embedded into an embedding compound 4, ground and optionally provided, at its top side 6t, with a connecting layer 80 that electrically conductively connects the top compensation laminae 21 and thus the first load terminals 11 (FIG. 26), and be arranged in a housing 41, 42, 50, and be electrically connected from outside the housing 41, 42, 50. In this case, as already explained, the housing 41, 42, 50 can include an electrically conductive top contact plate 41, an electrically conductive bottom contact plate 42, and a dielectric spacer ring 50. FIGS. 25 and 26 illustrate the arrangement in accordance with FIG. 23 after the encapsulation of the semiconductor chips 1 with the embedding compound 4 and the subsequent curing and grinding in cross section (FIG. 25) and in plan view (FIG. 26). In FIG. 27, which illustrates a plan view of the chip assemblage in accordance with FIG. 26, the printed circuit board and the spring elements 85, which are hidden by the connecting layer 80 and the embedding compound 4, and also the top compensation laminae 21, which are exposed in the embedding compound 4 but are hidden by the connecting layer 80, are illustrated by dashed lines.

As is evident from FIG. 26, a chip assemblage can optionally also include two or more main electrode interconnection structures 80, each of which brings about a permanently electrically conductive connection between the first load terminals 11. In the case of the arrangement in accordance with FIG. 26, for example, the connecting layer 80, which permanently electrically conductively connects the top compensation laminae 21 on those sides thereof which face away from the semiconductor chips 1, in the same way as the connecting layer 80 in accordance with FIGS. 17 and 21, serves as a sliding medium during the pressure contacting, which will be explained later, in order to reduce the mechanical stresses that typically arise during the pressure contacting and thus to avoid cracking in the chip assemblage.

Instead of a prefabricated printed circuit board, the control electrode interconnection structure 70 and the main electrode interconnection structure 80 can in each case also be embodied as a metallic leadframe and can be electrically insulated from one another by an intervening dielectric layer 75. The dielectric layer 75 can be a film, for example, composed of polyimide, for example. Optionally, the two leadframes together with the intervening dielectric layer 75 can be prefabricated as a composite wherein the two leadframes are adhesively bonded with the intervening dielectric layer 75.

Instead of the use of a prefabricated printed circuit board, the control electrode interconnection structure 70 and the main electrode interconnection structure 80 can in each case also be embodied as a metallic leadframe and be mounted in a manner spaced apart from one another on the semiconductor chips 1. If the semiconductor chips 1 are then connected to one another by the embedding compound 4, the embedding compound 4 also penetrates into the gap between the two leadframes and forms the dielectric layer 75 there.

As was illustrated with the aid of exemplary embodiments explained above, a control electrode interconnection structure 70 can be embedded into the embedding compound 4 and buried in the latter. In this case, the control electrode interconnection structure 70 can be covered by a portion of the embedding compound 4 on its side facing away from the semiconductor chips 1. As was likewise illustrated, the main electrode interconnection structure 80 can also be embedded into the embedding compound 4 and be buried in the latter. In this case, the main electrode interconnection structure 80 can be covered by a portion of the embedding compound 4 on its side facing away from the semiconductor chips 1. Alternatively, however, the main electrode interconnection structure 80 can also be applied to the embedding compound 4 and the top compensation laminae 21 embedded into the latter.

In accordance with a further exemplary embodiment, explained with reference to FIGS. 28 to 30, it is also possible, however, for both the control electrode interconnection structure 70 and the main electrode interconnection structure 80 not to be embodied as buried structures in the embedding compound 4, but rather onto a previously produced assemblage comprising the semiconductor chips 1 and the embedding compound 4 fixedly connecting the semiconductor chips 1 to one another.

For this purpose, firstly, an arrangement as explained with reference to FIG. 13 is produced, although with the differences that the control electrodes 13 are initially not yet electrically connected to a control electrode interconnection structure 70 and that the thicknesses of the contact elements 23 are chosen to be equal or approximately equal to the thicknesses of the top compensation laminae 21, wherein the thickness are to be determined in each case in the vertical direction v. This gives rise, as a result of the grinding of the assemblage 5, to a residual assemblage wherein the top compensation laminae 21 and contact elements 23 embedded into the embedding compound 4 are exposed and can thus be electrically contacted. This is carried out by means of a conductor track structure which, as is illustrated in cross section and in plan view respectively in FIGS. 28 and 29, is applied to the assemblage comprising the semiconductor chips 1, the top compensation laminae 21, the contact elements 23 and the embedding compound 4. The conductor track structure can be embodied, as illustrated, as a metallization layer in which one conductor track forms the control electrode interconnection structure 70 and a further conductor track forms the main electrode interconnection structure 80. Optionally, the control electrode interconnection structure 70, on its side facing away from the semiconductor chips 1, can then also be covered by a dielectric layer 75 (omitted in FIG. 29) in order to avoid later short circuits.

Figure 28:
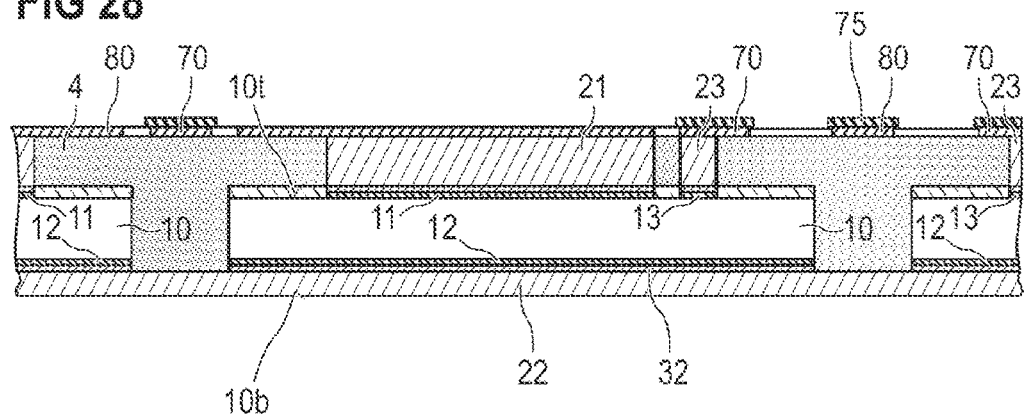
FIG. 28 illustrates a vertical section through a portion of a chip assemblage wherein the control electrode interconnection structure and the main electrode interconnection structure are embodied as conductor tracks of a structured metallization layer that was applied to the surface of an assemblage wherein a plurality of semiconductor chips are fixedly connected by an embedding compound.
Figure 29:
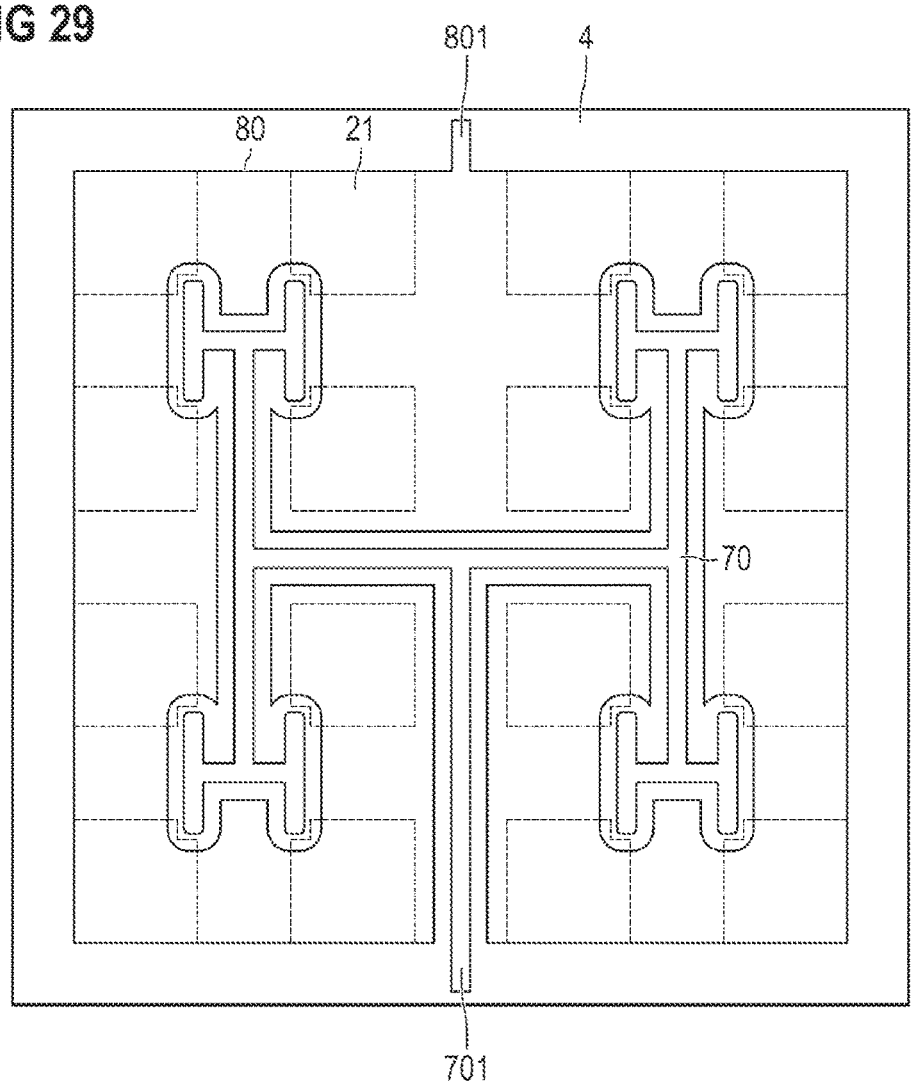
FIG. 29 illustrates a plan view of the chip assemblage in accordance with FIG. 28.

FIG. 30 illustrates the chips assemblage (purely) pressure-contacted by a top and a bottom contact plate 41 and 42 in accordance with FIG. 28 after incorporation into a housing 41, 42, 50 as explained above. For each of the semiconductor chips 1, the top contact plate 41 has, on its side facing the chip assemblage, a dedicated contact projection 411 that contacts the main electrode interconnection structure 80 on that side thereof which faces away from the relevant semiconductor chip 1.

The connecting layer 80 can for example comprise ruthenium or consist of ruthenium, and/or it can e.g. comprise aluminum or consist of aluminum. The connecting layer 80 additionally serves as a sliding medium in order to reduce the mechanical stresses that typically arise during the pressure contacting and thus to avoid cracking in the chip assemblage.

A further exemplary embodiment will now be explained with reference to FIGS. 31 to 42. FIG. 31 illustrates a semiconductor chip 1 having the construction already explained with reference to FIG. 1. A bottom compensation lamina 22 is cohesively connected to the semiconductor chip 1 at the bottom main electrode 12 by means of a connecting layer 32 formed from a connecting material 32', thus giving rise to a chip assembly 2 such as is illustrated in FIG. 32. The corresponding indications from the description of FIG. 1 hold true for the connecting material 32', the material and the thickness d22' of the bottom compensation lamina 22.

Figure 33:
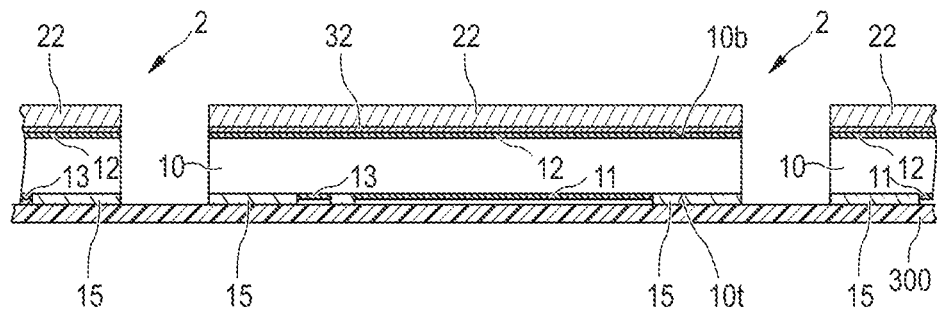
Figure 34:
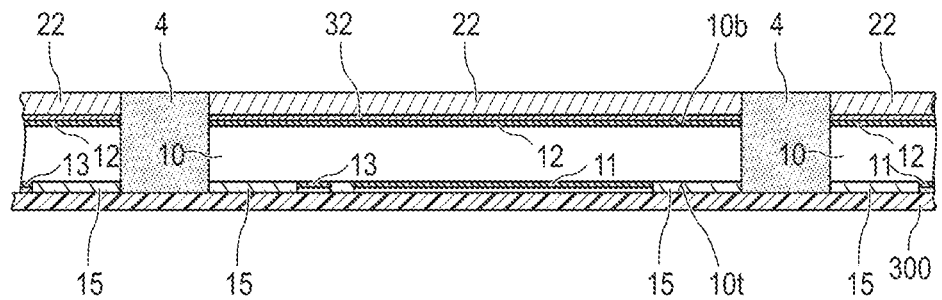

As is furthermore illustrated in FIG. 33, a plurality of such chip assemblies 2 are positioned in a predefined arrangement on an auxiliary carrier 300 such that the top main electrodes 11 and the control electrodes 13 face the auxiliary carrier 300. In order to prevent the chip assemblies 2 from slipping on the auxiliary carrier 300, the latter can have an adhesive surface, or an adhesive film can be used in order to fix the chip assemblies 2 on the auxiliary carrier 300. In this case, the passivation layers 15 of the semiconductor chips 1 can bear on the auxiliary carrier 300 or, if appropriate, on an adhesive film situated between the semiconductor chips 1 and the auxiliary carrier 300. During the subsequent encapsulation of the semiconductor chips 1 with an embedding compound 4, this prevents the embedding compound 4 from covering the top main electrodes 11 and the control electrodes 13. After the encapsulation and curing of the embedding compound, the assemblage formed is ground at its side facing away from the top main electrodes 11 and the control electrodes 13, such that the bottom compensation laminae 22 are exposed, which is illustrated as the result in FIG. 34.

Figure 35:
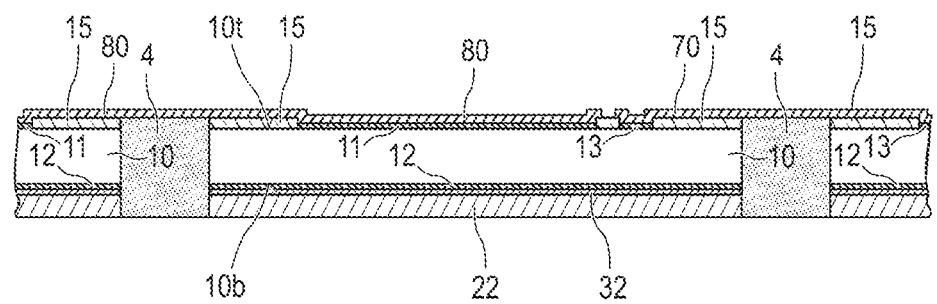

After the removal of the ground assemblage from the auxiliary carrier 300, a structured metallization layer having conductor tracks can be produced on the assemblage, which is illustrated as the result in FIG. 35. One of the conductor tracks forms a control electrode interconnection structure 70, which electrically conductively connects the control electrodes 13 to one another, and another conductor track forms the main electrode interconnection structure 80, which electrically conductively connects the top compensation laminae 21 and thus the first main electrodes 11 to one another.

The structured metallization layer can be embodied using thin-film technology, for example, by virtue of its being deposited conformally on the assemblage comprising the semiconductor chips 1 and the embedding compound 4 by means of a deposition method, for example PVD (=physical vapor deposition, e.g. sputtering), CVD (=chemical vapor deposition) or plating. In this case, by way of example, firstly an areally closed, i.e. unstructured, metal layer can be deposited conformally and can then be structured in any desired manner to form conductor tracks, for example by means of a masked etch using a photolithographically patterned etching mask. On account of production by means of a deposition method, the metallization layer follows the contour of the support to which it is applied. Therefore, the control electrode interconnection structure 70 and/or the main electrode interconnection structure 80 can be embodied in each case in a non-planar fashion: optionally, for example, the control electrode interconnection structure 70, in the case of each of the semiconductor chips 1, can physically contact both the control electrode 13 of said semiconductor chip and the passivation layer 15 thereof situated on the top side 10t in each case on the side thereof facing away from the semiconductor body 10. The control electrode interconnection structure 70 can in this case additionally bear directly on the embedding compound 4. Likewise optionally, for example, the main electrode interconnection structure 80, in the case of each of the semiconductor chips 1, can physically contact both the first main electrode 11 of said semiconductor chip and the passivation layer 15 thereof situated on the top side 10t in each case at the side thereof facing away from the semiconductor body 10. The main electrode interconnection structure 80 can in this case additionally bear directly on the embedding compound 4.

The control electrode interconnection structure 70 and/or the main electrode interconnection structure 80 can for example comprise ruthenium or consist of ruthenium, and/or it can e.g. comprise aluminum or consist of aluminum. The main electrode interconnection structure 80 additionally serves as a sliding medium in order to reduce the mechanical stresses that typically arise during pressure contacting and thus to avoid cracking in the chip assemblage.

The structured metallization layer can be embodied using thin-film technology, for example, by virtue of its being deposited conformally by means of a deposition method (e.g. sputtering, PVD). In this case, by way of example, firstly an areally closed, i.e. unstructured, metal layer can be deposited conformally and can then be structured in any desired manner to form conductor tracks, for example by means of a masked etch using a photolithographically patterned etching mask. On account of production by means of a deposition method, the metallization layer follows the contour of the support to which it is applied. Therefore, the control electrode interconnection structure 70 and/or the main electrode interconnection structure 80 can be embodied in each case in a non-planar fashion: optionally, for example, the control electrode interconnection structure 70, in the case of each of the semiconductor chips 1, can physically contact both the control electrode 13 of said semiconductor chip and the passivation layer 15 thereof situated on the top side 10t in each case on the side thereof facing away from the semiconductor body 10. The control electrode interconnection structure 70 can in this case additionally bear directly on the embedding compound 4. Likewise optionally, for example, the main electrode interconnection structure 80, in the case of each of the semiconductor chips 1, can physically contact both the first main electrode 11 of said semiconductor chip and the passivation layer 15 thereof situated on the top side 10t in each case at the side thereof facing away from the semiconductor body 10. The main electrode interconnection structure 80 can in this case additionally bear directly on the embedding compound 4.

The thicknesses of such conductor tracks 70 and/or 80 can be chosen arbitrarily, in principle; they can lie in the range of 30 μm to 70 μm, for example.

Figure 36:
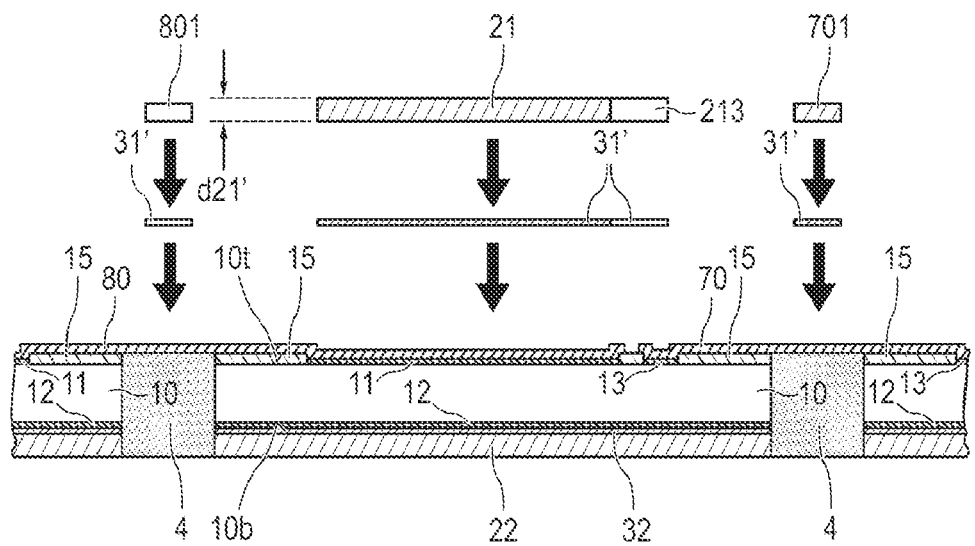
Figure 37:
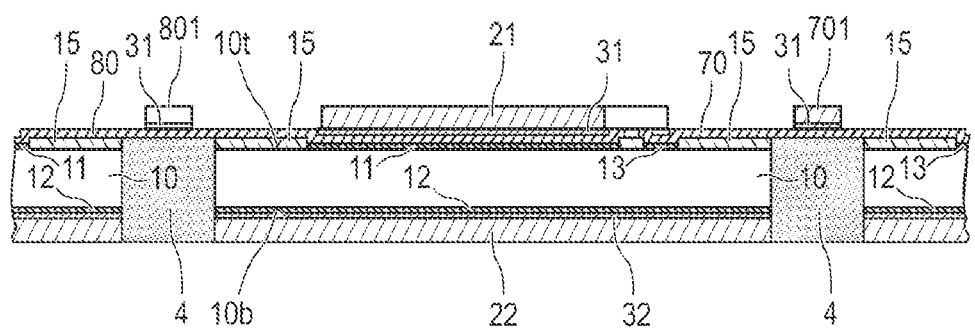

As is furthermore illustrated as the result in FIG. 37, above each of the semiconductor chips 1, i.e. on that side of said semiconductor chip which faces away from the main electrode interconnection structure 80, a top compensation lamina 21 is cohesively and electrically conductively connected to the main electrode interconnection structure 80 by means of a top connecting layer 31, such that a portion of the main electrode interconnection structure 80 is arranged between each of the semiconductor chips 1 and the relevant top compensation lamina 21 arranged above said semiconductor chip 1. The arrangement therefore has a number of pairs each having a top compensation lamina 21 and a bottom compensation lamina 22, said number corresponding to the number of semiconductor chips 1, wherein exactly one of the semiconductor chips 1 is arranged between the top and bottom compensation laminae 21, 22 of each of the pairs. Likewise by means of the top connecting layer 31, for the purpose of producing a terminal location 701 of the control electrode interconnection structure 70 and for the purpose of producing a terminal location 801 of the main electrode interconnection structure 80, an electrically conductive contact piece is in each case cohesively and electrically conductively connected to the control electrode interconnection structure 70 and to the main electrode interconnection structure 80, respectively. FIG. 36 shows the provided top compensation laminae 21, the contact piece 701 and the contact piece 801 and the original connecting means 31' from which the top connecting layer arises after the production of the cohesive and electrically conductive connections. The corresponding indications from the description of FIG. 1 hold true for the connecting material 31', the material and the thicknesses d21' of the top compensation laminae 21. The contact pieces 701 and/or 801 can optionally consist of the same material or the same material composition as the top compensation laminae 21.

Figure 38:
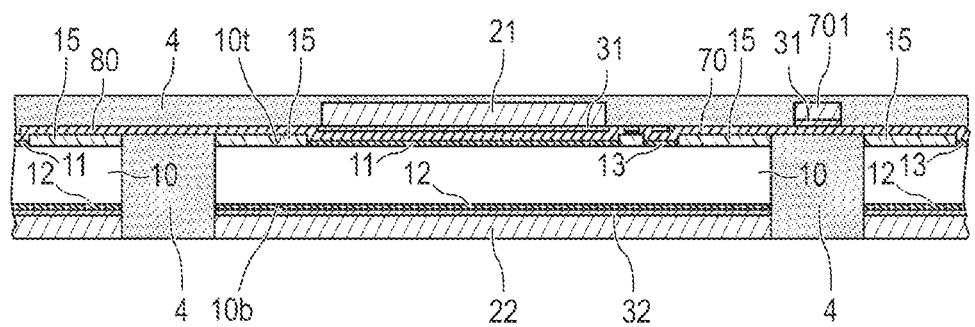

The present assemblage, such as was explained with reference to FIG. 37, is thereupon encapsulated with embedding compound 4 from its side facing away from the bottom compensation laminae 22 in accordance with the method explained with reference to FIGS. 8 to 12, the result of which is illustrated in FIG. 38.

Figure 39:
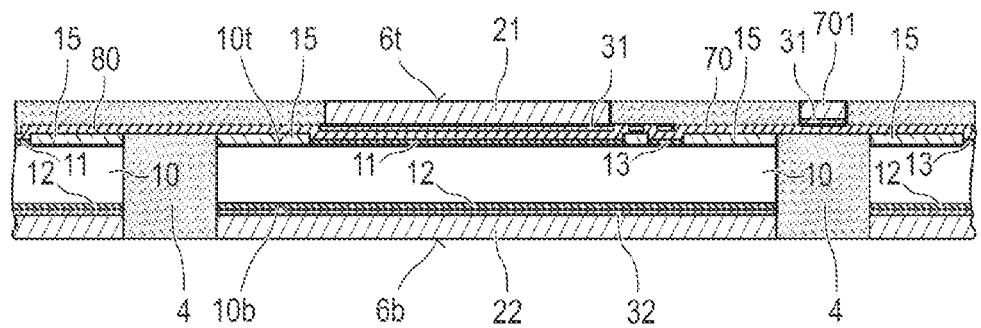
Figure 40:
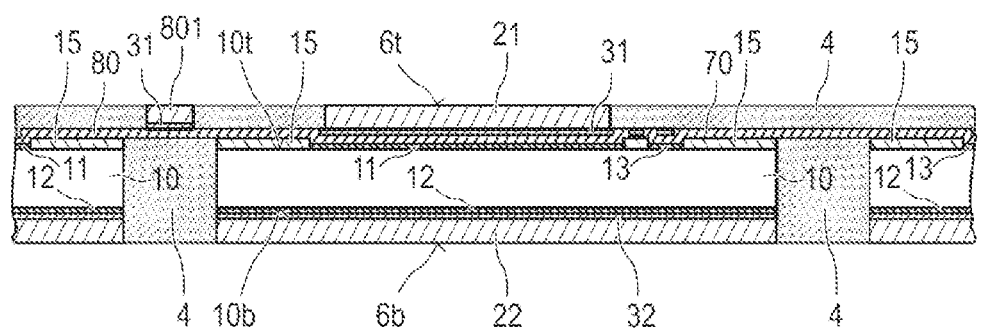
Figure 41:
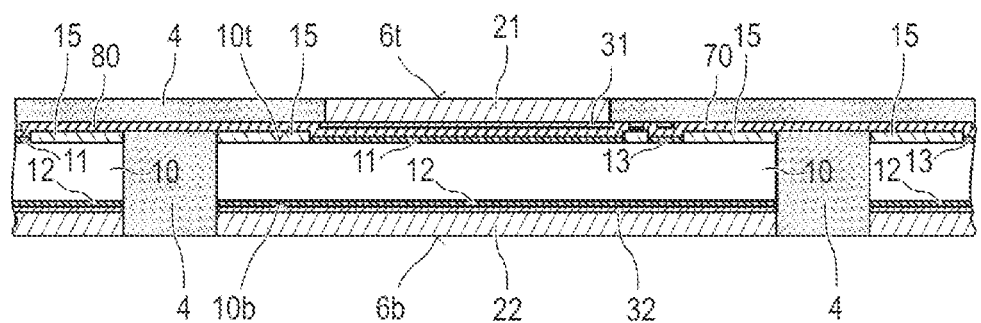

The assemblage 5 in accordance with FIG. 38 can then be ground at its side facing away from the bottom compensation laminae 22, such that the remaining residual assemblage 6 constitutes a chip assemblage, as is illustrated as the result with the aid of various sectional views in FIGS. 39, 40 and 41, having plane-parallel top sides and undersides 6t and 6b, respectively. After the grinding, each of the (slightly ground) top compensation laminae 21 is exposed at the top side 5t, such that they can be electrically contacted. The control electrode interconnection structure 70 is embedded into the embedding compound 4, i.e. the control electrode interconnection structure 70 is covered by a cover layer formed from the embedding compound 4. In any case, the embedding compound 4, even after the grinding, ensures that the semiconductor chips 1 are fixedly and cohesively connected to one another. The grinding can be carried out for example by machining (grinding, polishing, lapping, etc.) of the assemblage in a conventional wafer grinding installation.

As a result of the grinding, the thicknesses d21 (in the vertical direction v, see FIG. 13) of the top compensation laminae 21 are slightly reduced compared with their original thicknesses d21' (see FIG. 1), for example by approximately 0.1 mm. However, the reduced thickness d21 can still be, for example, at least 0.4 mm, at least 0.9 mm or at least 1.4 mm.

The sectional view in accordance with FIG. 39 passes through one of the top compensation laminae 21 and the contact piece 701, the sectional view in accordance with FIG. 40 passes through one of the top compensation laminae 21 and the contact piece 801, and the sectional view in accordance with FIG. 41 passes through one of the top compensation laminae 21. In this case, the chip assemblage comprises only exactly one contact piece 701 and exactly one contact piece 801.

Figure 42:
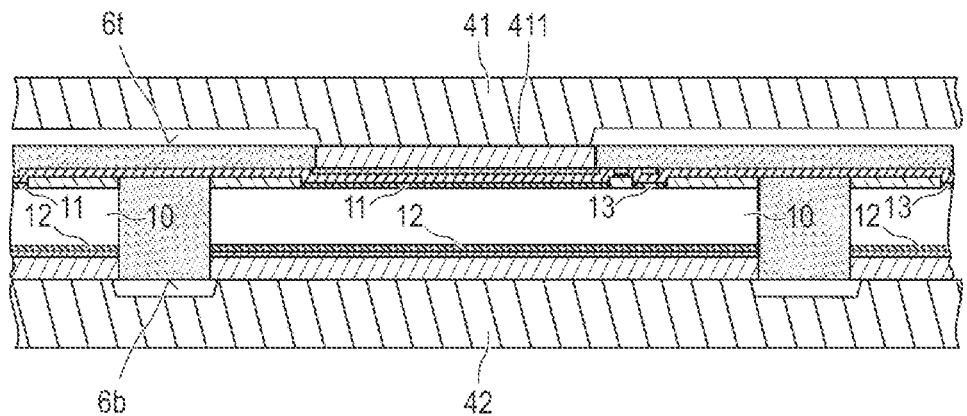
FIG. 42 illustrates a vertical section through a portion of a press pack cell including a chip assemblage embodied in accordance with FIGS. 39 to 41.

A chip assemblage such as was explained with reference to FIGS. 39 to 41 can be incorporated, as already explained, into a housing having a top contact plate 41, a bottom contact plate 42 and a dielectric spacer ring 50 arranged between them. For each of the semiconductor chips 1, the top contact plate 41 has, on its side facing the chip assemblage, a dedicated contact projection 411 that contacts the main electrode interconnection structure 80 on that side thereof which faces away from the relevant semiconductor chip 1, which is illustrated in FIG. 42.

An explanation has been given above, on the basis of various examples, of how a chip assemblage can be constructed or produced wherein a plurality of semiconductor chips 1 are fixedly connected to one another by an embedding compound 4 and which includes, in particular, a main electrode interconnection structure 80, which permanently electrically conductively connects the first main electrodes 11 of the semiconductor chip 1 to one another. In this case, the individual semiconductor chips 1 are electrically connected in parallel with one another, which means that all of the first main electrodes 11 are permanently electrically conductively connected to one another, that all of the second main electrodes 12 are (optionally: permanently) electrically conductively connected to one another, and that all of the control electrodes 13 are permanently electrically conductively connected to one another. Moreover, such a chip assemblage includes a contact location 801 at which the reference potential present at the first main electrodes 11 for driving the semiconductor chips 1 is present during operation.

The semiconductor chips 1 can contain a controllable semiconductor component, for example, wherein an electrical load path is formed between the first main electrode 11 and the second main electrode 12 and wherein an electric current through the electrical load path can be controlled, switched on or switched off by means of a control signal (e.g. an electrical drive potential) being applied to the control electrode 13. By way of example, for this purpose, a drive voltage can be applied between the terminal location 801 (=reference potential for drive potential) and the terminal location 701, such that, in the case of each of the semiconductor chips 1 substantially the same drive voltage is present between its first main electrode 11 and its control electrode 13. In this way, the parallel-connected semiconductor chips 1 or the parallel-connected semiconductor components contained therein can be switched synchronously and in an in-phase manner. In principle, all of the semiconductor chips 1 can be constructed identically, but differently constructed semiconductor chips 1 can also be used.

Suitable controllable semiconductor components are e.g. field effect transistors having an electrically insulated gate, for example MOSFETs or IGBTs. In these cases, the gate electrodes constitute the control electrodes 13. In the case of MOSFETs, the source electrodes constitute the first main electrodes 11 and the drain electrodes constitute the second main electrodes 12, and, in the case of IGBTs, the emitter electrodes constitute the first main electrodes 11 and the collector electrodes constitute the second main electrodes 12.

If a chip assemblage such as was explained above is incorporated into a housing 41, 42, 50 having a top contact plate 41, a bottom contact plate 42 and a dielectric spacer ring 50, then a press pack cell arises wherein the chip assemblage is arranged between the top contact plate 41 and the bottom contact plate 42 in such a way that the first main electrodes 11 of the semiconductor chips 1 are situated at that side of the respective semiconductor chip 1 which faces the top contact plate 41, and the second main electrodes 12 of the semiconductor chips 1 are situated at that side of the respective semiconductor chip 1 which faces the bottom contact plate 42.

Figure 43:
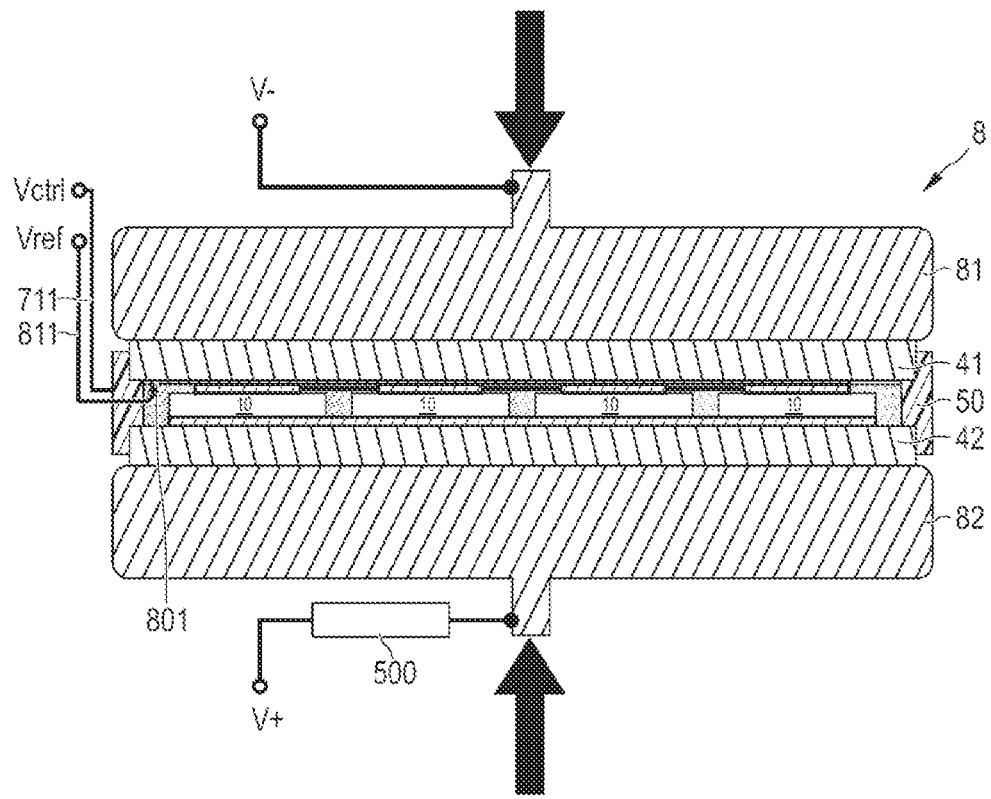
FIG. 43 illustrates a vertical section through an arrangement wherein a press pack cell is clamped in between two pressure contact pieces and is electrically contacted by the latter in the process.

Such a press pack cell (here on the basis of the example of a press pack cell in accordance with FIG. 19) can then be clamped, as is illustrated in FIG. 43 (here on the basis of the example of a chip assemblage in accordance with FIG. 15), in between an electrically conductive top pressure contact piece 81 and an electrically conductive bottom pressure contact piece 82 in such a way that there is in each case an electrical pressure contact connection between the top pressure contact piece 81 and the top contact plate 41 and between the bottom pressure contact piece 82 and the bottom contact plate 42. The pressure contact connections can optionally be pure pressure contact connections. The finished pressure contact arrangement 8 comprising the press pack cell, the top pressure contact piece 81 and the bottom pressure contact piece 82 can then be electrically interconnected. By way of example, the pressure contact arrangement 8 can be connected in series with a resistive and/or inductive load 500 between a positive supply potential V+ and a negative supply potential V−. A reference potential Vref used for driving the press pack cell is fed to the press pack cell not via the top contact plate 41, but rather independently of the latter via a separate terminal line 811. Moreover, a control potential Vctrl used for driving is fed to the press pack cell via a terminal line 711. Although the separate terminal line 811 is electrically conductively connected to the first main electrodes 11 in the same way as the top contact plate 41, there exists between the separate terminal line 811 and the first main electrodes 11 an (at least one) electrically conductive connection (i.e. current path) which does not lead via the top contact plate 41. Unlike in conventional press pack cells, the reference potential for electrical driving is not tapped off at the top contact plate 41, but rather at the terminal location 811 of the chip assemblage that is spaced apart from the top contact plate 41.

Such a pressure contact arrangement 8 can be realized not only with press pack cells which are constructed in accordance with FIG. 19 and include a chip assemblage in accordance with FIG. 15, but also with press pack cells which contain any other chip assemblage explained.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A chip assemblage comprising:
    a plurality of semiconductor chips, each comprising:
        a semiconductor body having an underside and a top side, spaced apart from the underside in a vertical direction;
        a top main electrode arranged on the top side;
        a bottom main electrode arranged on the underside;
        a control electrode, arranged on the top side, by means of which an electric current between the top main electrode and the bottom main electrode can be controlled;
        a dedicated, electrically conductive top compensation lamina arranged on a side of the top main electrode which faces away from the semiconductor body, the top compensation lamina being cohesively and electrically connected to the top main electrode;
    a dielectric embedding compound in which the plurality of semiconductor chips are embedded and cohesively connected to one another to form a solid assemblage, wherein a top side of the top compensation lamina for the plurality of semiconductor chips is exposed at a top side of the assemblage; and
    an electrically conductive connecting layer over the top side of the assemblage that is electrically coupled to the top compensation lamina for each semiconductor chip.

2. The chip assemblage of claim 1, wherein the top compensation lamina has a coefficient of linear thermal expansion of less than 11 ppm/K or of less than 7 ppm/K at a temperature of 20° C.

3. The chip assemblage of claim 1, wherein the top compensation lamina comprises molybdenum or consists of molybdenum.

4. A chip assemblage comprising:
    a plurality of semiconductor chips, each comprising:
        a semiconductor body having an underside and a top side, spaced apart from the underside in a vertical direction;
        a top main electrode arranged on the top side;
        a bottom main electrode arranged on the underside;
        a control electrode, arranged on the top side, by means of which an electric current between the top main electrode and the bottom main electrode can be controlled;
        a common control terminal which is electrically connected to each of the control electrodes via a control electrode interconnection structure; and
        a common reference potential terminal, which is electrically connected to each of the top main electrodes via a main electrode interconnection structure;
    a dedicated, electrically conductive top compensation lamina for each semiconductor chip, the top compensation lamina being arranged on a side of the top main electrode which faces away from the semiconductor body, and being cohesively and electrically connected to the top main electrode; and a dielectric embedding compound, by which the semiconductor chips are cohesively connected to one another to form a solid assemblage.

5. The chip assemblage of claim 4, wherein for each of the semiconductor chips, a portion of the main electrode interconnection structure is arranged between the semiconductor chip and a portion of the embedding compound.

6. The chip assemblage of claim 4, wherein the main electrode interconnection structure bears directly on an outer surface of the embedding compound.

7. The chip assemblage of claim 4, wherein the main electrode interconnection structure, for each of the top compensation laminae, has a dedicated spring element which electrically pressure-contacts the relevant top compensation lamina by pressing resiliently against said top compensation lamina perpendicularly to the vertical direction, such that said top compensation lamina is electrically conductively connected to a reference potential terminal via the spring element.

8. The chip assemblage of claim 4, wherein the main electrode interconnection structure, for each of the semiconductor chips, is arranged between said semiconductor chip and the top compensation lamina of said semiconductor chip.

9. The chip assemblage of claim 4, wherein the main electrode interconnection structure, for each of the semiconductor chips, electrically and physically contacts the top compensation lamina of said semiconductor chip at the side facing away from the relevant semiconductor chip.

10. The chip assemblage of claim 4, wherein the main electrode interconnection structure comprises a conductor track of a printed circuit board or is embedded as such.

11. The chip assemblage of claim 4, wherein the main electrode interconnection structure comprises a thin-film conductor track embodied as a conformally deposited conductor track, wherein the thin-film conductor track, in the case of each of the semiconductor chips, physically contacts both the first main electrode of the semiconductor chip and a chip passivation, applied to the top side of the semiconductor body of the semiconductor chip, in each case on the side facing away from the semiconductor body.

12. The chip assemblage as claimed in claim 4, wherein the reference potential terminal is exposed at the outer side of the chip assemblage and can thereby be electrically contacted.

13. The chip assemblage as claimed in claim 4, which comprises only exactly one reference potential terminal.

14. A press pack cell comprising:
an electrically conductive top contact plate and an electrically conductive bottom contact plate;
a chip assemblage, the chip assemblage being arranged between the top contact plate and the bottom contact plate in such a way that the first main electrodes are situated at that side of the respective semiconductor chip which faces the top contact plate, and the second main electrodes are situated at that side of the respective semiconductor chip which faces the bottom contact plate, wherein the chip assemblage comprises:
a plurality of semiconductor chips, each comprising:
a semiconductor body having an underside and a top side, spaced apart from the underside in a vertical direction;
a top main electrode arranged on the top side;
a bottom main electrode arranged on the underside;
a control electrode, by means of which an electric current between the top main electrode and the bottom main electrode can be controlled; and
a dedicated, electrically conductive top compensation lamina for each semiconductor chip, the top compensation lamina being arranged on a side of the top main electrode which faces away from the semiconductor body, and being cohesively and electrically connected to the top main electrode;
a dielectric embedding compound, by which the semiconductor chips are cohesively connected to one another to form a solid assemblage;
a common control terminal which is electrically connected to each of the control electrodes via a control electrode interconnection structure; and
a common reference potential terminal, which is electrically connected to each of the top main electrodes via a main electrode interconnection structure.

15. The press pack cell of claim 14, comprising an electrical terminal line which is accessible from the outer side of the press pack cell and can thus be electrically contacted and which is electrically conductively connected to the reference potential terminal, wherein between the terminal line and each of the first main electrodes there is an electrically conductive connection that does not lead via the top contact plate.

16. The press pack cell of claim 14, comprising a dielectric spacer ring, which is arranged between the top contact plate and the bottom contact plate and concomitantly together with them forms a housing in which the chip assemblage is arranged.

17. The press pack cell of claim 14, wherein the chip assemblage is arranged loosely between the top contact plate and the bottom contact plate.

18. A method for operating a press pack cell comprising:
providing a press pack cell of claim 14;
providing an electrically conductive top pressure contact piece and an electrically conductive bottom pressure contact piece;
clamping the press pack cell between the top pressure contact piece and the bottom pressure contact piece in such a way that there is a pure electrical pressure contact between the top pressure contact piece and the top contact plate, and that there is a pure electrical pressure contact between the bottom pressure contact piece and the bottom contact plate; and
connecting the top pressure contact piece and the bottom pressure contact piece to an electrical voltage source, such that different electrical potentials are present at the top pressure contact piece and the bottom pressure contact piece; and
connecting a control voltage between the reference potential terminal and the control terminal.

* * * * *